United States Patent [19]
Nomura et al.

[11] Patent Number: 5,765,048
[45] Date of Patent: Jun. 9, 1998

[54] TELESCOPING TYPE OF ZOOM LENS AND CAM MECHANISM THEREFOR

[75] Inventors: Hiroshi Nomura; Kazuyoshi Azegami; Takamitsu Sasaki, all of Tokyo, Japan

[73] Assignee: Asahi Kogaku Kogyo Kabushiki Kaisha, Tokyo, Japan

[21] Appl. No.: 781,023

[22] Filed: Jan. 9, 1997

[30] Foreign Application Priority Data

| Jan. 26, 1996 | [JP] | Japan | 8-12317 |
| Feb. 21, 1996 | [JP] | Japan | 8-34122 |
| Feb. 21, 1996 | [JP] | Japan | 8-34132 |

[51] Int. Cl.[6] ........................... G03B 17/00
[52] U.S. Cl. .................. 396/72; 396/85; 359/696; 359/700; 359/704
[58] Field of Search .................. 396/72, 85, 87, 396/529; 359/696, 699, 700, 701, 704

[56] References Cited

U.S. PATENT DOCUMENTS

| 4,759,618 | 7/1988 | Kamata . | |
| 4,944,030 | 7/1990 | Haraguchi et al. . | |
| 5,177,639 | 1/1993 | Kohmoto . | |
| 5,231,449 | 7/1993 | Nomura . | |
| 5,245,476 | 9/1993 | Shono . | |
| 5,255,124 | 10/1993 | Iwamura | 359/700 |
| 5,262,898 | 11/1993 | Nomura | 359/700 |
| 5,386,740 | 2/1995 | Nomura et al. | 359/704 |
| 5,535,057 | 7/1996 | Nomura et al. | 396/72 |
| 5,543,971 | 8/1996 | Nomura et al. | 359/700 |
| 5,581,411 | 12/1996 | Nomura et al. | 359/704 |
| 5,604,638 | 2/1997 | Nomura et al. | 359/704 |
| 5,636,064 | 6/1997 | Nomura et al. | 359/704 |
| 5,652,922 | 7/1997 | Kohno | 396/72 |
| 5,659,810 | 8/1997 | Nomura et al. | 396/72 |
| 5,661,609 | 8/1997 | Nomura et al. | 359/700 |

OTHER PUBLICATIONS

United Kingdom Search Report.

*Primary Examiner*—Russell E. Adams
*Attorney, Agent, or Firm*—Greenblum & Bernstein, P.L.C.

[57] ABSTRACT

A lens barrel has first, second and third barrels concentrically arranged in this order from an optical axis. The lens barrel includes at least one cam slot formed on the second barrel and extending oblique to a direction of the optical axis, at least one guide groove formed on an inner periphery of the third barrel, at least one follower formed on an outer periphery of the first barrel and engaging with the at least one guide groove through the at least one cam slot, and at least one member integrally formed on an outer periphery of the second barrel adjacent to an end of the at least one cam slot. The at least one member includes a surface formed thereon to contact the at least one follower when the at least one follower moves to the end of the at least one cam slot.

25 Claims, 22 Drawing Sheets

TELESCOPING TYPE OF ZOOM LENS AND CAM MECHANISM THEREFOR

BACKGROUND OF THE INVENTION

1. Field of the Invention

The present invention relates to a telescoping type of zoom lens having a plurality of concentrically arranged moving barrels which advance from or retract into a stationary barrel of the zoom lens. The present invention also relates to a cam mechanism which can be used in such a telescoping type of zoom lens for producing a predetermined movement between two concentrically arranged moving barrels.

2. Description of the Related Art

A telescoping type of zoom lens having a plurality of concentrically arranged moving barrels is well known. This type of zoom lens is widely utilized in a lens-shutter type of zoom compact camera in order to reduce the thickness of the camera when not in use.

In such a zoom lens, in order to realize a moving barrel (first barrel) to be movable forward or rearward along an optical axis of the zoom lens relative to a second barrel (which may be a stationary barrel or a moving barrel) in which the moving barrel is positioned, male and female helicoids (helicoid threads) are often formed on an outer periphery of the moving barrel and an inner periphery of the second barrel, respectively. The moving barrel is positioned in the second barrel with the male helicoid engaging with the female helicoid. Due to the arrangement of the helicoids, the moving barrel moves along the optical axis while rotating about the optical axis relative to the second barrel when the moving barrel is driven to rotate about the optical axis. Instead of using such helicoids, in order to realize the moving barrel to move forward or rearward along the optical axis relative to the second barrel, it is also often the case that a plurality of cam slots or grooves, which are parallel to one another and oblique to the optical axis direction, are formed on the second barrel and a corresponding plurality of follower pins are fixed on the moving barrel. In this case, the moving barrel is positioned in the second barrel with the follower pins respectively engaging with the cam slots or grooves, so that the moving barrel moves along the optical axis while rotating about the optical axis relative to the second barrel.

In such a zoom lens, if a strong impact is applied to the front end of the zoom lens in a direction of retraction thereof while the moving barrel is advanced from the second barrel, the moving barrel is forced to retract back into the second barrel while rotating. For this reason, in order to protect a gear train provided in a drive mechanism for moving the moving barrel from being damaged, a clutch is generally provided in the gear train. However, if a strong impact is applied to the front end of the zoom lens in a direction of retraction thereof while the moving barrel is fully retracted in the second barrel, the moving barrel is forced to rotate in a rotational direction to further retract into the second barrel. This results in damage to the moving barrel, the second barrel and/or other peripheral members. This is particularly the case where the lead of the helicoids or the lead of the cam slots or grooves is large, i.e., where the helicoids or the cam slots or grooves are formed such that the moving barrel moves by a large distance along the optical axis per unit amount of rotation of the moving barrel relative to the second barrel.

It is well known to provide a zoom lens in which a moving barrel (first barrel) is guided along an optical axis without rotating thereabout relative to another barrel (second barrel). The zoom lens is driven to move along the optical axis by a cam mechanism which includes a cam ring concentrically arranged to the first barrel. The cam ring is provided with a plurality of cam slots in which a corresponding plurality of followers are respectively fitted, so that the first barrel moves along the optical axis 0 relative to the second barrel when the cam ring rotates about the optical axis relative to the first barrel. In such a conventional zoom lens, the cam slots are formed on the cam ring such that side surfaces of each cam slot, which determine a predetermined contoured cam surface thereof, extend parallel to each other and substantially perpendicular to a part of the wall of the cam ring where the cam slot is formed. However, when a molded cam ring is provided with a plurality of cam slots having such a shape, it is necessary to utilize a mold having a complicated structure consisting of a plurality of complicated mold pieces.

SUMMARY OF THE INVENTION

An object of the present invention is to provide a telescoping type of zoom lens having a plurality of moving barrels concentrically arranged, which is provided with a mechanism for preventing the zoom lens from being damaged when a strong impact is applied to the front end of the zoom lens in a direction of retraction thereof when the zoom lens is in a fully retracted state.

Another object of the present invention is to provide a cam mechanism including a cam ring which is provided with a plurality of cam slots for producing a predetermined movement between two moving barrels concentrically arranged, which can be used in a telescoping type of zoom lens and which does not require that the cam ring by molded by a complicated mold structure.

To achieve the former object mentioned above, according to an aspect of the present invention, there is provided a lens barrel having first, second and third barrels concentrically arranged in this order from an optical axis. The lens barrel includes at least one cam slot formed on the second barrel and extending oblique to a direction of the optical axis, at least one guide groove formed on an inner periphery of the third barrel, at least one follower formed on an outer periphery of the first barrel and engaging with the at least one guide groove through the at least one cam slot, and at least one member integrally formed on an outer periphery of the second barrel adjacent to an end of the at least one cam slot. The at least one member includes a surface formed thereon to contact the at least one follower when the at least one follower moves to the end of the at least one cam slot.

Preferably, the end of the at least one cam slot is a rear end of the at least one cam slot, so that the at least one follower contacts the surface when the first barrel is fully retracted into the second barrel.

Preferably, the at least one follower includes a follower projection formed on the outer periphery of the first barrel, and a ring member supported on the follower projection. The follower projection and the ring member engage with the at least one cam slot and the at least one guide groove, respectively, and the ring member contacts the surface when the follower projection moves to the end of the cam slot.

Preferably, the follower projection and the at least one cam slot, which engage with each other, are each tapered in a direction away from the optical axis.

Preferably, the at least one cam slot is formed at a predetermined oblique angle to the direction of the optical axis.

Preferably, the end of the at least one cam slot is provided with an end slot which extends in a circumferential direction of the second barrel, and the at least one member is formed along the end slot.

According to another aspect of the present invention, there is provided a telescoping type of zoom lens having first, second and third barrels concentrically arranged in this order from an optical axis. The telescoping type of zoom lens includes a plurality of cam slots formed on the second barrel and extending parallel to one another oblique to a direction of the optical axis, a plurality of guide grooves formed on an inner periphery of the third barrel, a plurality of followers formed on an outer periphery of the first barrel and respectively engaging with the plurality of guide grooves through the plurality of cam slots, and a plurality of members each being integrally formed on an outer periphery of the second barrel adjacent to a rear end of a corresponding one of the plurality of cam slots. The plurality of followers respectively contact the plurality of members when the first barrel is fully retracted into the second barrel.

To achieve the latter object mentioned above, according to another aspect of the present invention, there is provided a cam mechanism for use in a photographic lens which includes a moving barrel and a cam ring fitted on the moving barrel such that the moving barrel is movable relative to the cam ring along an optical axis of the photographic lens. The cam mechanism includes at least one cam slot formed on the cam ring extending oblique to a direction of the optical axis which is formed such that a cross-section along a plane perpendicular to a longitudinal direction of the at least one cam slot tapers in a direction away from the optical axis. The cam mechanism also includes at least one follower projection integrally formed on the moving barrel which is formed to taper in the direction away from the optical axis to be firmly fitted in the at least one cam slot, at least one lead groove for the at least one follower projection to be inserted into the at least one cam slot during an assembly of the photographic lens which is formed on an inner periphery of a rear end of the moving barrel at a rear end of the at least one cam slot, at least one follower respectively provided on the at least one follower projection, and at least one stopper contacting the at least one follower when the moving barrel is fully retracted into the cam ring in order to prevent eh moving barrel from coming out of the cam ring from a rear end thereof. The at least one stopper is integrally formed on an outer periphery of the moving barrel adjacent to the rear end of the at least one cam slot.

Preferably, the at least one follower is a ring member secured onto the at least one follower projection by a fixing screw screwed in the at least one follower projection.

According to yet another aspect of the present invention, there is provided a cam mechanism used for a photographic lens which includes a moving barrel and a cam ring fitted on the moving barrel such that the moving barrel is movable relative to the cam ring along an optical axis of the photographic lens. The cam mechanism includes a plurality of cam slots formed on the cam ring extending parallel to one another oblique to a direction of the optical axis. Each of the plurality of cam slots is formed such that a cross-section along a plane perpendicular to a longitudinal direction thereof tapers in a direction away from the optical axis. Also included in the cam mechanism is a plurality of follower projections integrally formed on the moving barrel formed to taper in the direction away from the optical axis to be firmly fitted in a corresponding one of the plurality of cam slots, a plurality of lead grooves for each of the plurality of follower projections to be inserted into a corresponding one of the plurality of cam slots during an assembly of the photographic lens where each of the plurality of lead grooves are formed on an inner periphery of a rear end of the moving barrel at a rear end of a corresponding one of the plurality of cam slots, a plurality of followers each provided on a corresponding one of the plurality of follower projections, and a plurality of stoppers each contacting a corresponding one of the plurality of followers without contacting a corresponding one of the plurality of follower projections when the moving barrel is fully retracted into the cam ring in order to prevent eh moving barrel from coming out of the cam ring from a rear end thereof. Each of the plurality of stoppers are integrally formed on an outer periphery of the moving barrel adjacent to a rear end of a corresponding one of the plurality of cam slots.

The present disclosure relates to subject matter contained in Japanese Patent Application Nos. 8-12317, filed on Jan. 26, 1996, 8-34122, filed on Feb. 21, 1996, and 8-34132, filed on Feb. 21, 1996 which are expressly incorporated herein by reference in their entireties.

BRIEF DESCRIPTION OF THE DRAWINGS

The invention will be described below in detail with reference to the accompanying drawings in which similar elements are indicated by similar reference numerals, and wherein.

DESCRIPTION OF THE PREFERRED EMBODIMENT

Figure 19:
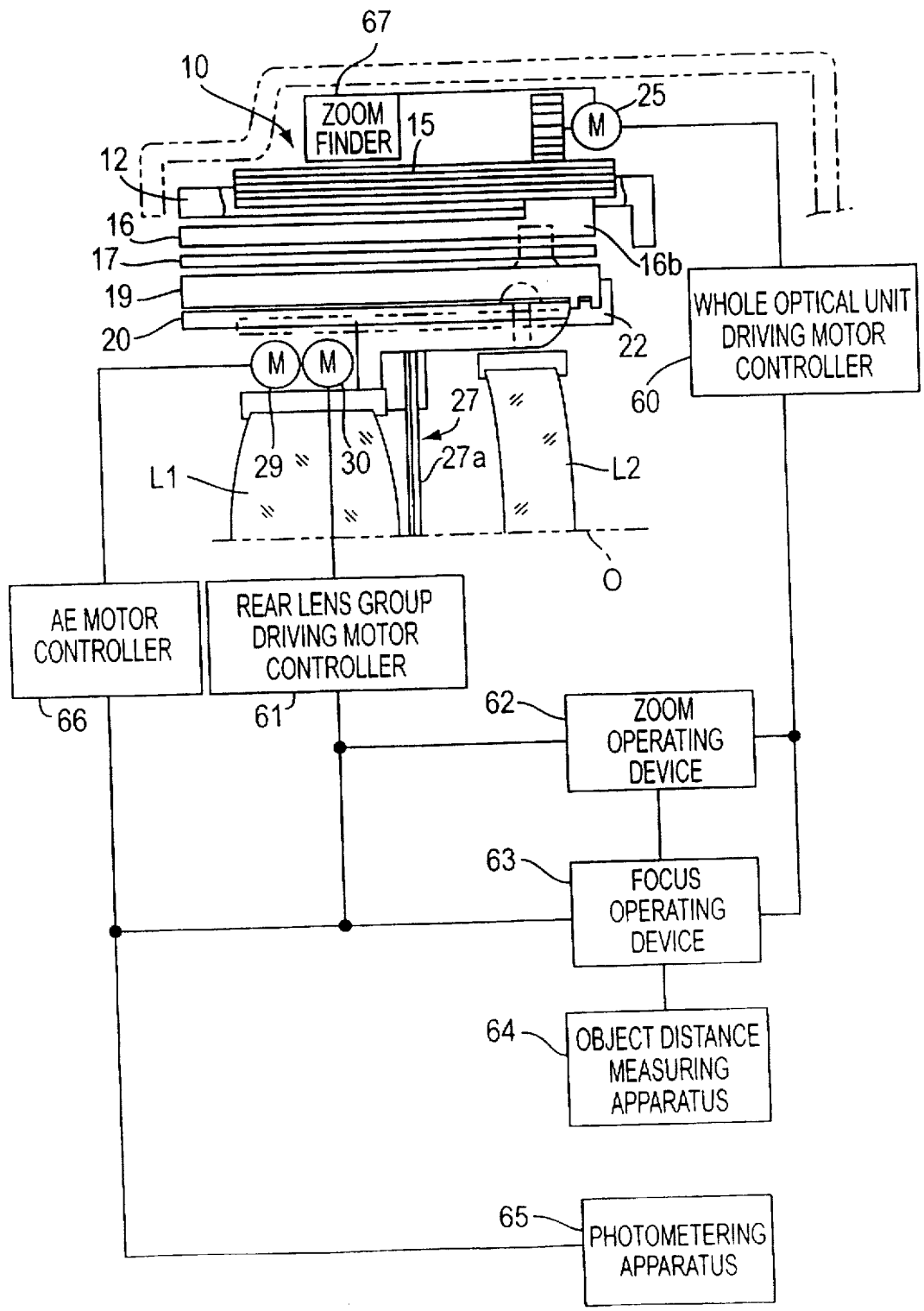
FIG. 19 is a block diagram of a controlling system for controlling an operation of the zoom lens barrel.

FIG. 19 is a schematic representation of various elements which comprise a preferred embodiment of a zoom lens camera to which the present invention is applied. A concept of the present zoom lens camera will now be described with reference to FIG. 19.

The zoom lens camera is provided with a zoom lens barrel (zoom lens) 10 of a three-stage delivery type (telescoping type) having three moving barrels, namely a first moving barrel 20, a second moving barrel 19 and a third moving barrel (rotational barrel) 16, which are concentrically arranged in this order from an optical axis 0. In the zoom lens barrel 10, two lens groups are provided as a photographic optical system, namely a front lens group L1 having positive power and a rear lens group L2 having negative power.

In the camera body, a whole optical unit driving motor controller 60, a rear lens group driving motor controller 61, a zoom operating device 62, a focus operating device 63, an object distance measuring apparatus 64, a photometering apparatus 65, and an AE (i.e., automatic exposure) motor controller 66, are provided. Although the specific focusing system of the object distance measuring apparatus 64, which is used to provide information regarding the object-to-camera distance, does not form part of the present invention, one such suitable system is disclosed in commonly assigned U.S. patent application Ser. No. 08/605,759, filed on Feb. 22, 1996, the entire disclosure of which is expressly incorporated by reference herein. Although the focusing systems disclosed in U.S. patent application Ser. No. 08/605,759 are of the so-called "passive" type, other known autofocus systems (e.g., active range finding systems such as those based on infrared light and triangulation) may be used. Similarly, a photometering system as disclosed in the above-noted U.S. patent application Ser. No. 08/605,759 could be implemented as photometering apparatus 65.

The zoom operating device 62 can be provided in the form of, for example, a manually-operable zoom operating lever (not shown) provided on the camera body or a pair of zoom buttons, e.g., a "wide" zoom button and a "tele" zoom button (not shown) provided on the camera body. When the zoom operation device 62 is operated, the whole optical unit driving motor controller 60 drives a whole optical unit driving motor 25 to move the front lens group L1 and the rear lens group L2, rearwardly or forwardly without regard to a focal length and a focal point thereof. In the following explanation, forward and rearward movements of the lens groups L1 and L2 by the whole optical unit driving motor controller 60 (the motor 25) are referred to as the movement toward "tele" and the movement toward "wide" respectively, since forward and rearward movements of the lens groups L1 and L2 occur when the zoom operating device 62 is operated to "tele" and "wide" positions.

The image magnification of the visual field of a zoom finder 67 provided in the camera body varies in accordance with the variation of the focal length through the operation of the zoom operating device 62. Therefore, the photographer can perceive the variation of the focal length by observing the variation of image magnification of the visual field of the finder. In addition, the focal length, as set by the operation of the zoom operating device 62, may be a value indicated by a value on an LCD (liquid crystal display) panel (not shown) or the like.

When the focus operating device 63 is operated, the whole optical unit driving motor controller 60 drives the whole optical unit driving motor 25. At the same time, the rear lens group driving motor controller 61 drives a rear lens group driving motor 30. The driving of the whole optical unit driving motor controller 60 and the rear lens group driving motor controller 61 causes the front and rear lens groups L1 and L2 to be moved to respective positions corresponding to a set focal length and a detected object distance, thereby the zoom lens is focused on the subject.

Specifically, the focus operating device 63 is provided with a release button (not shown) provided on an upper wall of the camera body. A photometering switch and a release switch (both not shown) are synchronized with the release button. When the release button is half-depressed (half step), the focus operating device 63 turns the photometering switch ON, and the object distance measuring and photometering commands are respectively input to the object distance measuring apparatus 64 and the photometering apparatus 65.

When the release button is fully depressed (full step), the focus operating device 63 turns the release switch ON, and according to the result of the object distance measurement and a set focal length, the whole optical unit driving motor 25 and the rear lens group driving motor 30 are driven, and the focusing operation is executed, in which the front lens group L1 and the rear lens group L2 move to the focusing position. Further, an AE motor 29 of an AF/AE (i.e., autofocus/autoexposure) shutter unit (electrical unit) 21 (FIG. 11) is driven via the AE motor controller 66 to actuate a shutter 27. During the shutter action, the AE motor controller 66 drives the AE motor 29 to open shutter blades 27a of the shutter 27 for a specified period of time according to the photometering information output from the photometering apparatus 65.

When the zoom operative device 62 is operated, the zoom operating device 62 drives the whole optical unit driving motor 25 to move the front and rear lens groups L1 and L2 together as a whole in the direction of the optical axis 0 (optical axis direction). The rear lens group driving motor 30 may also be driven via the rear lens group driving motor controller 61 to move the rear lens group L2 relative to the first lens group L1. However, this may not be performed under the conventional concept of zooming in which the focal length is varied sequentially without moving the position of the focal point.

When the zoom operating device 62 is operated, the following two modes are available:

1. A mode to move the front lens group L1 and the rear lens group L2 in the optical axis direction without varying the distance therebetween by driving only the whole optical unit driving motor 25; and
2. A mode to move the front lens group L1 and the rear lens group L2 in the optical axis direction while varying the distance therebetween by driving both the whole optical unit driving motor 25 and the rear lens group driving motor 30.

In mode 1, during a zooming operation an in-focus condition cannot be obtained at all times with respect to a subject located at a specific distance. However, in a lens-shutter type camera, since the image of the subject is not observed through the photographing optical system, but through the finder optical system provided separately from the photographing optical system, it is sufficient that the subject is only focused when the shutter is released. In mode 2, during a zooming operation the front lens group L1 and the rear lens group L2 are moved without regard to whether the focal point moves, and when the shutter is released, the focusing operation (focus adjusting operation) is carried out by moving both the whole optical unit driving motor 25 and the rear lens group driving motor 30.

When the focus operating device 63 is operated in at least one part of the focal length range set by the zoom operating device 62, the whole optical unit driving motor 25 and the rear lens group driving motor 30 are driven to bring the subject into focus. The amount of movement of each lens group L1 or L2 by the whole optical unit driving motor 25 and the rear lens group driving motor 30 is determined in accordance with subject distance information provided from the object distance measuring apparatus 64, and focal length information set by the zoom operating device 62. By moving both the whole optical unit driving motor 25 and the rear lens group driving motor 30 when the focus operating device 63 is operated, the position of the lens groups L1, L2 can be flexibly controlled in comparison to lens movements controlled by cam.

The zoom lens camera of this embodiment can also be controlled in a manner such that only the magnification of the zoom finder 67 and the focal length information are varied during an operation of the zoom operating device 62, without driving either the whole optical unit driving motor 25 or the rear lens group driving motor 30. Under this type of control, when the focus operating device 63 is operated, both the whole optical unit driving motor 25 and the rear lens group driving motor 30 are moved simultaneously according to the focal length information and the subject distance information obtained by the object distance measuring apparatus 64 to move the front lens group L1 and the rear lens group L2 to respective positions determined according to the focal length and the subject distance information.

An embodiment of the zoom lens barrel according to the above concept will now be described with reference to mainly FIGS. 17 and 18.

The overall structure of the zoom lens barrel 10 will firstly be described.

The zoom lens barrel 10 is provided with the first moving barrel 20, the second moving barrel 19, the third moving barrel 16, and a fixed lens barrel block 12. The third moving barrel 16 is engaged with a cylindrical portion 12p of the fixed lens barrel block 12, and moves in the optical axis direction upon being rotated. The third moving barrel 16 is provided on an inner periphery thereof with a linear guide barrel (cam ring or second barrel) 17, which is restricted in rotation. The linear guide barrel 17 and the third moving barrel 16 move together as a whole in the optical axis direction, with the third moving barrel 16 rotating relative to the linear guide barrel 17. The first moving barrel 20 moves in the optical axis direction with rotation thereof being restricted. The second moving barrel 19 moves in the optical axis direction, while rotating relative to the linear guide barrel 17 and the first moving barrel 20. The whole optical unit driving motor 25 is secured to the fixed lens barrel block 12. A shutter mounting stage 40 is secured to the first moving barrel 20. The AE motor 29 and the rear lens group driving motor 30 are mounted on the shutter mounting stage 40. The front lens group L1 and the rear lens group L2 are respectively supported by a lens supporting barrel (lens supporting annular member) 34 and a lens supporting barrel 50.

Figure 17:
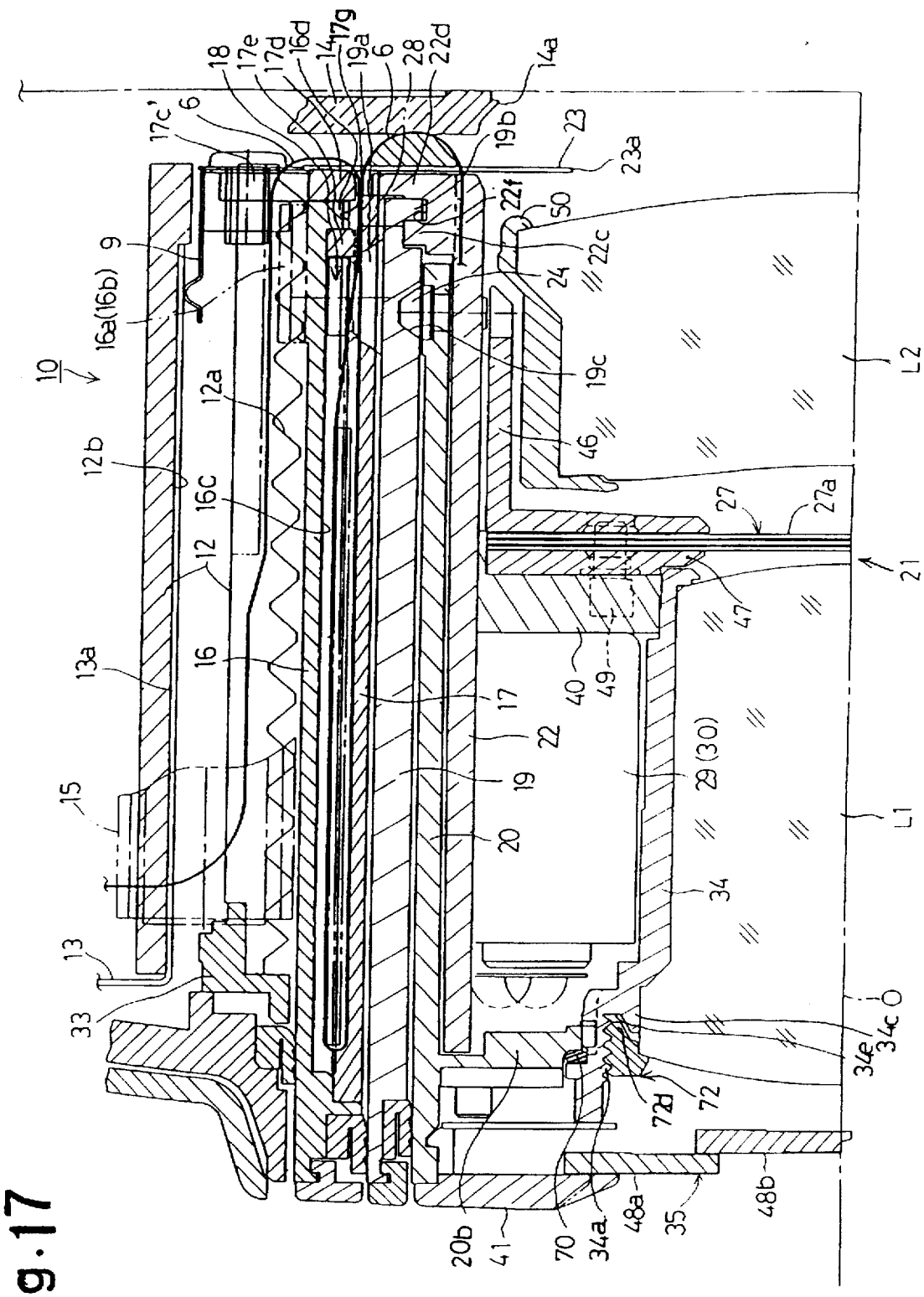
FIG. 17 is a sectional view of an upper part of the zoom lens barrel in the housed state.

An O-ring 70, made of a rubber or the like, is positioned between an outer peripheral circumferential surface of the front end of the lens supporting barrel 34, and an inner peripheral circumferential surface of an inner flange portion 20b integrally formed in the front end of the first moving barrel 20 as shown in FIG. 17. The O-ring 70 prevents water from penetrating the zoom lens barrel 10 at the front end thereof between the first moving barrel 20 and the lens supporting barrel 34.

Figure 20:
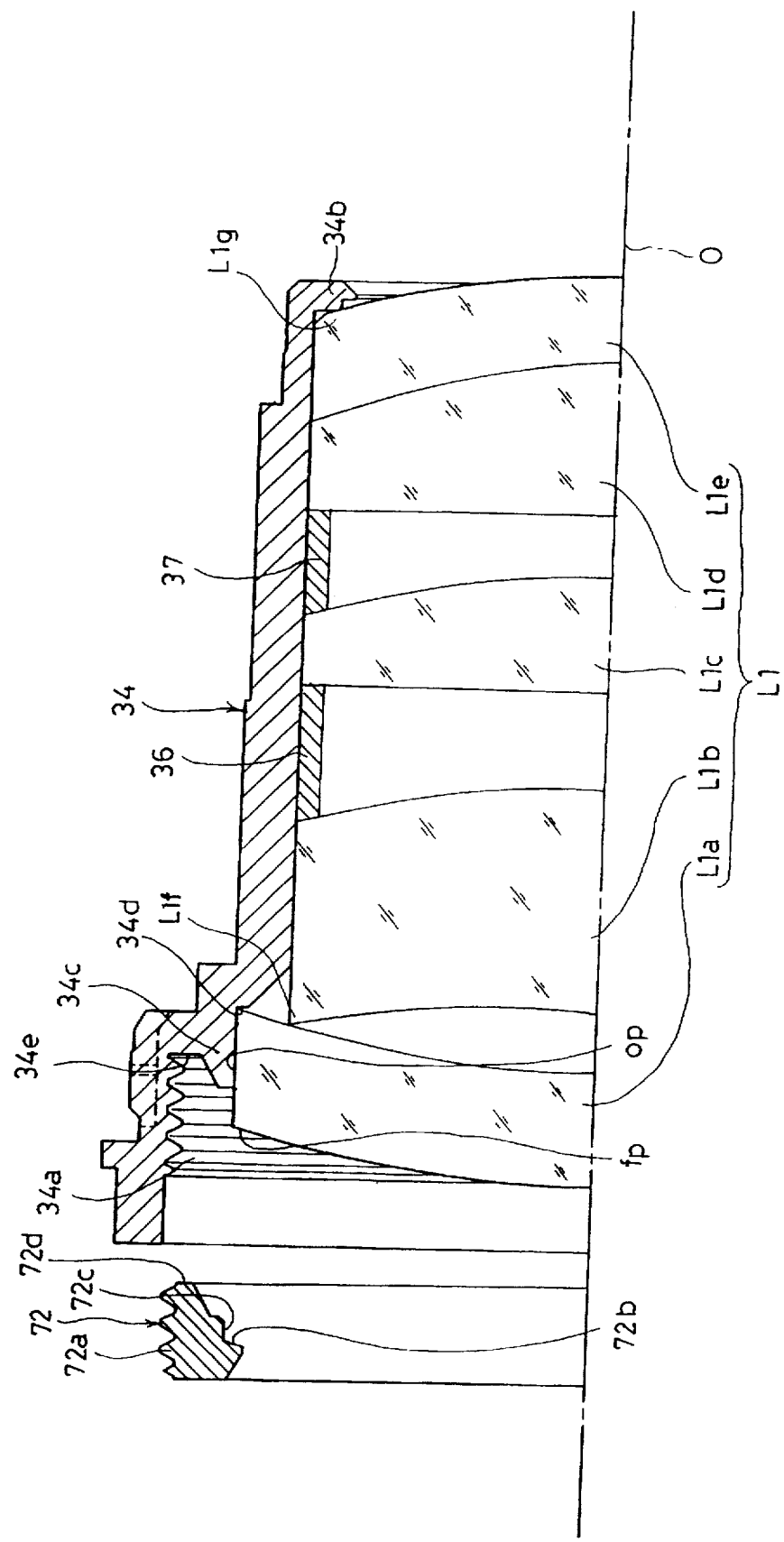
FIG. 20 is a sectional view of an upper part of a lens supporting barrel which supports a front lens group therein, and a lens fixing ring which is to be screw-engaged with the lens supporting barrel.

As shown in FIG. 20, the front lens group L1 consists of five lenses, namely a first lens (frontmost lens) L1a, a second lens L1b, a third lens L1c, a fourth lens L1d and a fifth lens L1e in this order from an object side to an image side, i.e., from the left hand side to the right hand side as viewed in FIG. 20.

A front positioning ring 36 for determining a distance between the second lens L1b and the third lens L1c is positioned and held between the second lens L1b and the third lens L1c. An outer peripheral surface of the positioning ring 36 is fitted on an inner peripheral surface of the lens supporting barrel 34. Likewise, a rear positioning ring 37 for determining a distance between the third lens L1c and the fourth lens L1d is positioned and held between the third lens L1c and the fourth lens L1d. An outer peripheral surface of the positioning ring 37 is fitted on an inner peripheral surface of the lens supporting barrel 34. The rear surface of the fourth lens L1d and the front surface of the fifth lens L1e are cemented to each other, so that the fourth and fifth lenses L1d, L1e are formed as a cemented or composite lens. A front circumferential edge L1f of the second lens L1b along the circumferential edge thereof contacts the rear surface of the first lens L1a. A rear circumferential edge L1g of the fifth lens L1e along the circumferential edge thereof contacts an inwardly-projecting flange 34b formed integral with the rear end of the lens supporting barrel 34.

Figure 21:
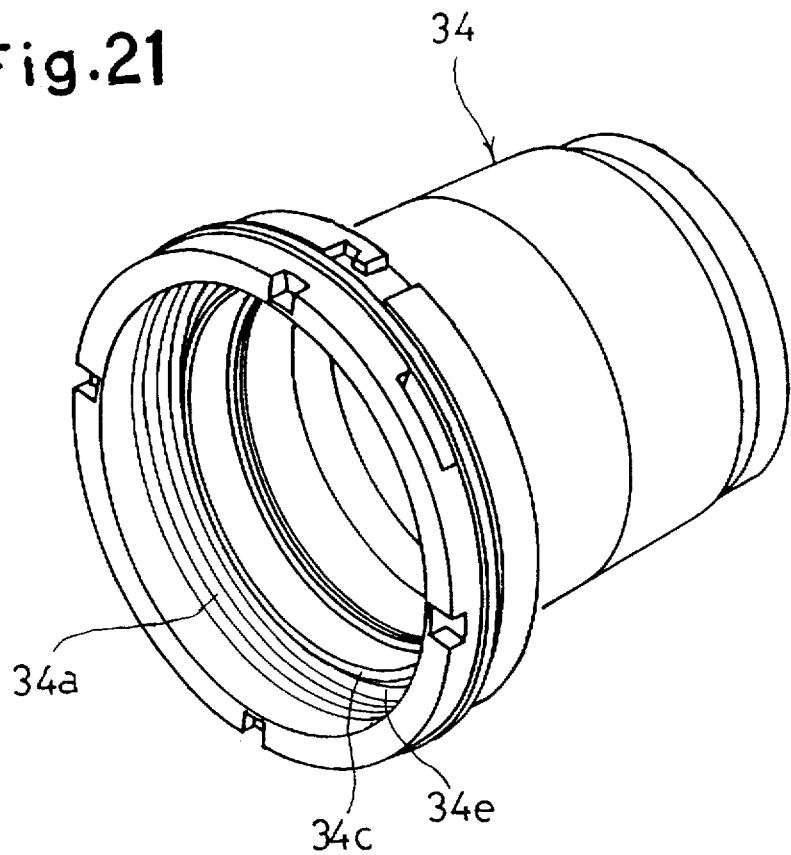
FIG. 21 is an enlarged perspective view of the lens supporting barrel shown in FIG. 20.

A female thread 34a is formed on an inner periphery of a front part of the lens supporting barrel 34, as shown in FIGS. 20 or 21. A lens fixing ring 72, for fixing the first lens L1a to the lens support barrel 34, engages with the lens supporting barrel 34. With this arrangement, a male thread 72a formed on the outer peripheral surface of the lens fixing ring 72 meshes with the female thread 34a. A circular abutting surface 72b is formed on the lens fixing ring 72 on an inner peripheral surface thereof. The circular abutting surface 72b comes into contact with a circumferential portion fp of the front surface of the first lens L1a in a state when the lens fixing ring 72 is properly screw-engaged with the lens supporting barrel 34. The circular abutting surface 72b is formed to be substantially parallel to the circumferential portion fp so that the circular abutting surface 72b and the circumferential portion fp may be brought tightly into contact with each other when the lens fixing ring 72 is properly screw-engaged with the lens supporting barrel 34.

A supporting ring portion 34c is formed integral with the lens supporting barrel 34. The supporting ring portion 34c is located inwardly from the female thread 34a in a radial direction of the lens supporting barrel 34. The inner peripheral surface of the supporting ring portion 34c, which extends in the optical axis direction, comes into contact with an outer circumferential edge or surface op of the first lens L1a. An annular positioning surface 34d, extending substantially normal to the optical axis 0, is formed on the lens supporting barrel 34 immediately behind the supporting ring portion 34c. The circumferential edge of the rear surface of the first lens L1a comes into contact with the positioning surface 34d. With this structure, the first lens L1a is immovably held between the circular abutting surface 72b and the positioning surface 34d in the optical axis direction, and the first lens L1a is immovably held by the supporting ring portion 34c in a radial direction normal to the optical axis 0.

Figure 22:
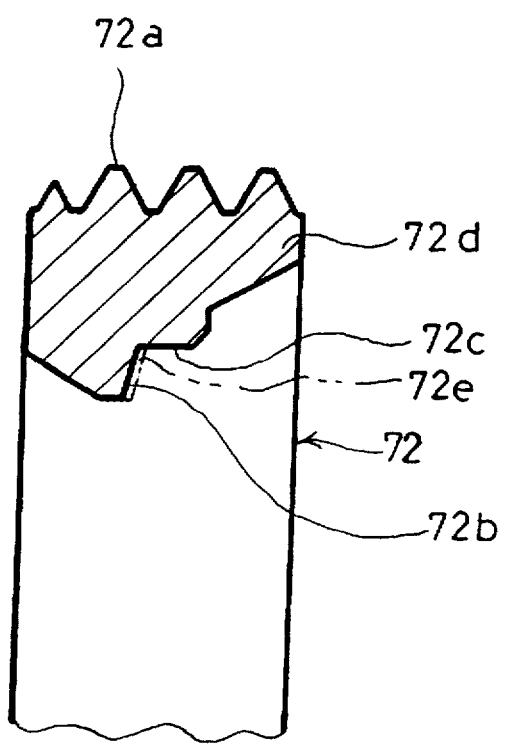
FIG. 22 is an enlarged sectional view of a part of the lens fixing ring shown in FIG. 20.

As shown in FIG. 22, a coating 72e is coated on the circular abutting surface 72b. The coating 72e is a waterproof coating made of a synthetic resin. In the present embodiment, Fantas Coat SF-6 (trademark of a coating produced by the Japanese Company "Origin Denki Kabushiki Kaisha") is used as the coating 72e. The front surface of the first lens L1a is formed very smooth, whereas the circular abutting surface 72b of the lens fixing ring 72 is not formed as smoothly (i.e., has a rough finish) as the front surface of the first lens L1a. This is because the first lens L1a is more minutely and accurately formed than the lens fixing ring 72 since the first lens L1a is a precision optical element. Because of the differences in the finishes, in the absence of the coating 72e on the circular abutting surface 72b, a substantial gap would be formed between the circular abutting surface 72b and the circumferential portion fp. This would be the case even if the circular abutting surface 72b was properly and tightly in contact with the circumferential portion fp by properly screw-engaging the lens fixing ring 72 with the female thread 34a. As a result, water or moisture would be able to penetrate into the lens supporting barrel 34 through the substantial gap. However, in the present embodiment, the coating 72e is applied to the circular abutting surface 72b so as to make the surface thereof a smooth surface which eliminates the substantial gap between the circular abutting surface 72b and the circumferential portion fp when the circular abutting surface 72b properly contacts the circumferential portion fp. Accordingly, the coating 72e, positioned and held between the circular abutting surface 72b and the circumferential portion fp, effectively prevents water or moisture from penetrating the lens supporting barrel 34 between the circular abutting surface 72b and the circumferential portion fp when the circular abutting surface 72b is properly and tightly in contact with the circumferential portion fp by properly screw-engaging the lens fixing ring 72 with the female thread 34a.

A circular surface 72c is formed on the lens fixing ring 72. The circular surface 72c is connected to the circular abutting surface 72b and is located immediately outward in a radial direction from the circular abutting surface 72b. A front part of the outer circumferential surface op of the first lens L1a (i.e., a circumferential edge of the first lens L1a) comes into contact with the circular surface 72c when the lens fixing ring 72 properly engages with the female thread 34a. Due to the circular surface 72c contacting the outer circumferential surface op, the watertight structure between the circular abutting surface 72b and the circumferential portion fp, that is realized by the coating 72e, is enhanced. That is, a highly efficient watertight connection between the first lens L1a and the lens fixing ring 72 is realized by providing both the coating 72e and the circular surface 72c with the lens fixing ring 72.

An annular recessed portion 34e is formed on the lens supporting barrel 34 between the female thread 34a and the supporting ring portion 34c. As shown in FIG. 17, in a state where the lens fixing ring 72 is properly screw-engaged with the female thread 34a, a rear end 72d of the lens fixing ring 72 is positioned in the annular recessed portion 34e with the rear end 72d not contacting the bottom (i.e., rearmost end) of the recessed portion 34e. In particular, an annular space is formed in the annular recessed portion 34e between the rear end 72d and the bottom of the recessed portion 34e.

The fixed lens barrel block 12 is fixed in front of an aperture plate 14 fixed to the camera body. The aperture plate 14 is provided on a center thereof with a rectangular-shaped aperture 14a which forms the limits of each frame exposed. The fixed lens barrel block 12 is provided on an inner periphery of the cylindrical portion 12p, with a female helicoid 12a, and also a plurality of linear guide grooves 12b each extending parallel to the optical axis 0, i.e., extending in the optical axis direction. At the bottom of one of the linear guide grooves 12b, namely 12b', a code plate 13a, having a predetermined code pattern, is fixed. The code plate 13a extends in the optical axis direction and extends along substantially the whole of the length of the fixed lens barrel block 12. The code plate 13a is part of a flexible printed circuit board 13 positioned outside the fixed lens barrel block 12.

Figure 13:
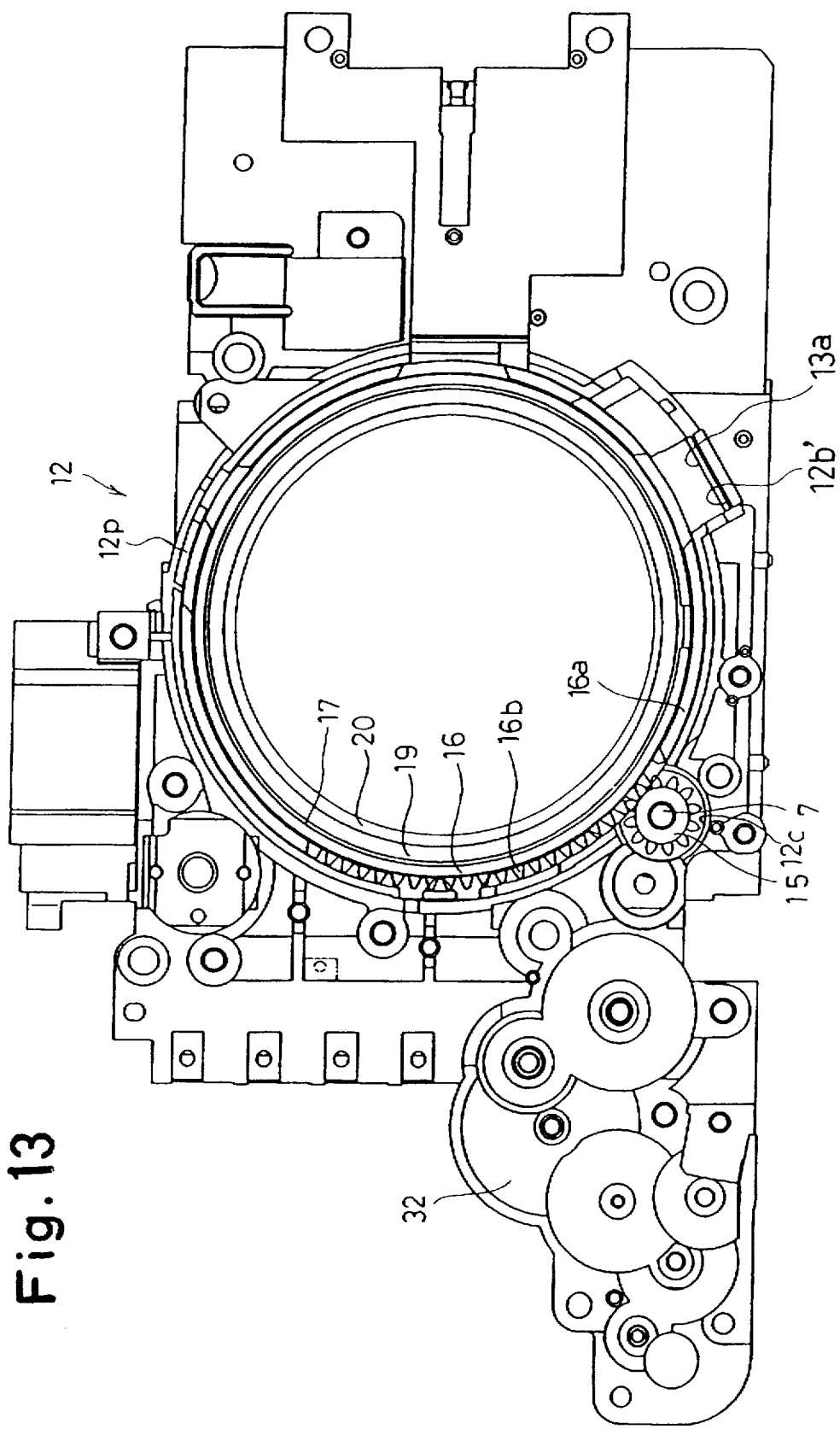
FIG. 13 is a front elevational view of a fixed lens barrel block of the zoom lens barrel.
Figure 18:
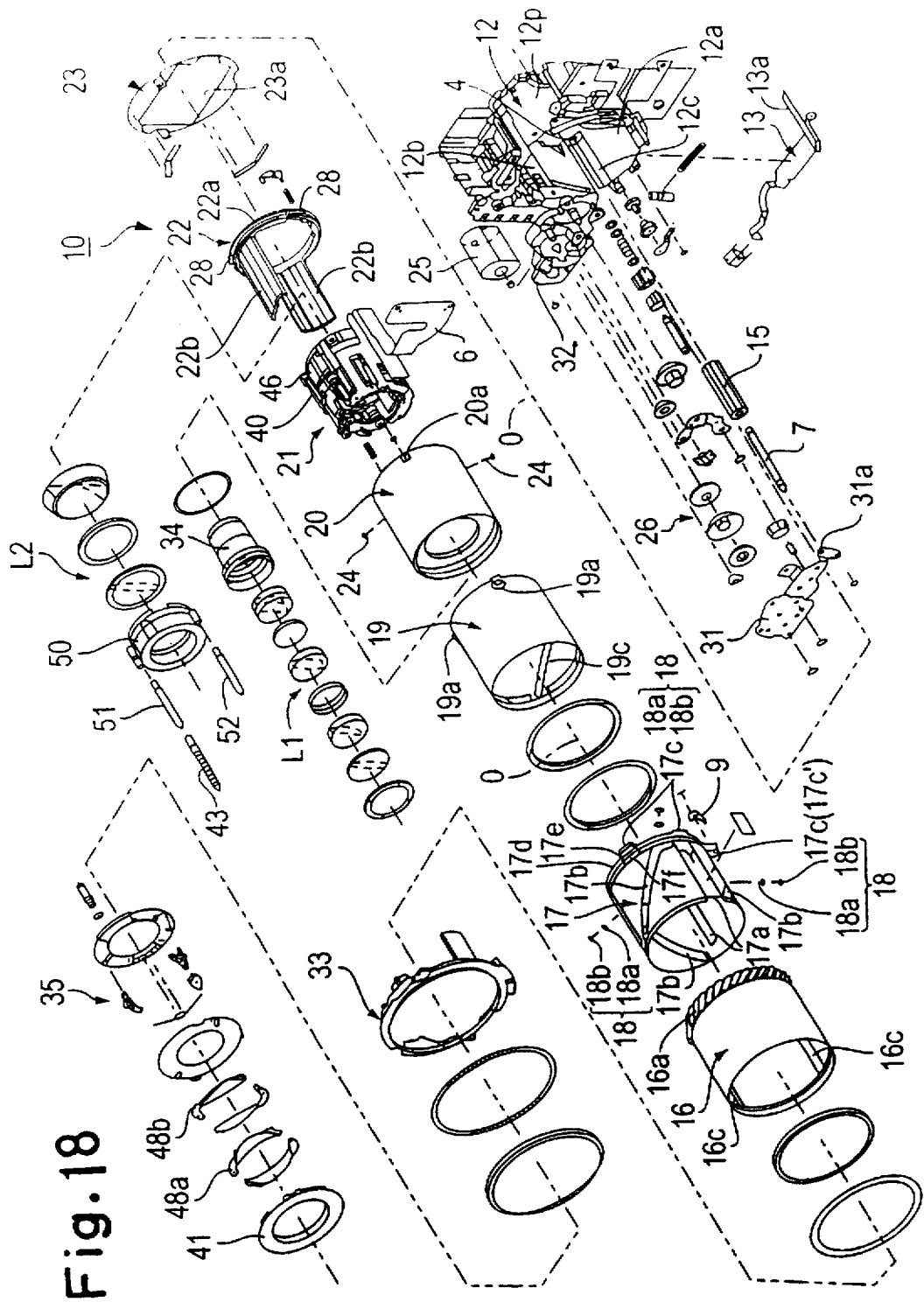
FIG. 18 is an exploded perspective view of the overall structure of the zoom lens barrel.

As shown in FIGS. 13 and 18, in the fixed lens barrel block 12, a gear housing 12c is provided which is recessed outwardly from an inner periphery of the cylindrical portion 12p of the fixed lens barrel block 12 in a radial direction while extending in the optical axis direction. In the gear housing 12c, a driving pinion 15 is rotatably held and extends in the optical axis direction. Both ends of an axial shaft 7 of the driving pinion 15 are rotatively supported by a supporting hollow 4, provided in the fixed lens barrel block 12, and a supporting hollow 31a, provided on a gear supporting plate 31 fixed on the fixed lens barrel block 12 by set screws (not shown), respectively. Part of the teeth of the driving pinion 15 project inwardly from the inner periphery of the cylindrical portion 12p of the fixed lens barrel block 12 so that the driving pinion 15 meshes with an outer peripheral gear 16b of the third moving barrel 16, as shown in FIG. 13.

Figure 12:
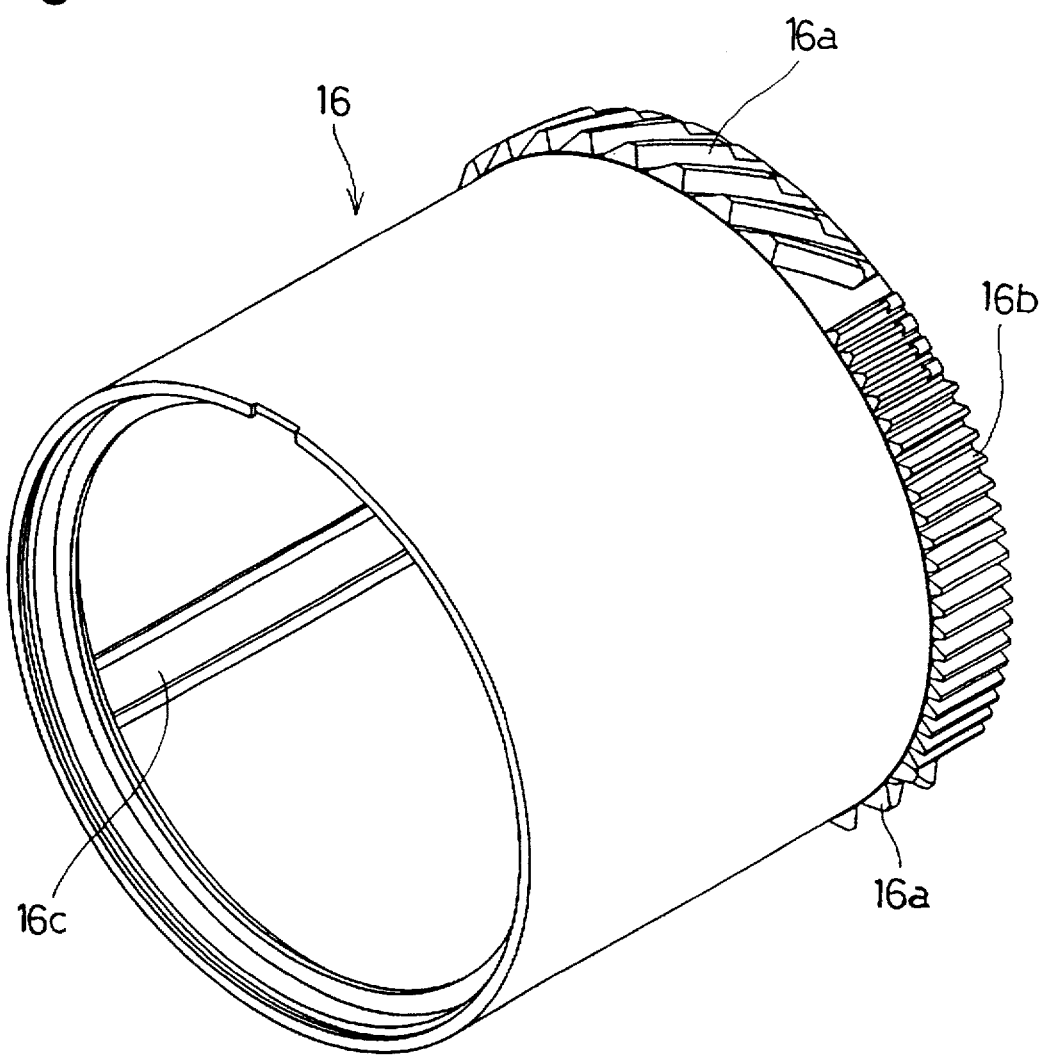
FIG. 12 is an enlarged schematic perspective view of the third moving barrel of the zoom lens barrel.

On an inner periphery of the third moving barrel 16, a plurality of linear guide grooves 16c are formed, each extending parallel to the optical axis 0. At an outer periphery of the rear end of the third moving barrel 16, a male helicoid 16a and the aforementioned outer peripheral gear 16b are provided as shown in FIG. 12. The male helicoid 16a engages with the female helicoid 12a of the fixed lens barrel block 12. The outer peripheral gear 16b engages with the driving pinion 15. The driving pinion 15 has an axial length sufficient to be capable of engaging with the outer peripheral gear 16b throughout the entire range of movement of the third moving barrel 16 in the optical axis direction.

Figure 1:
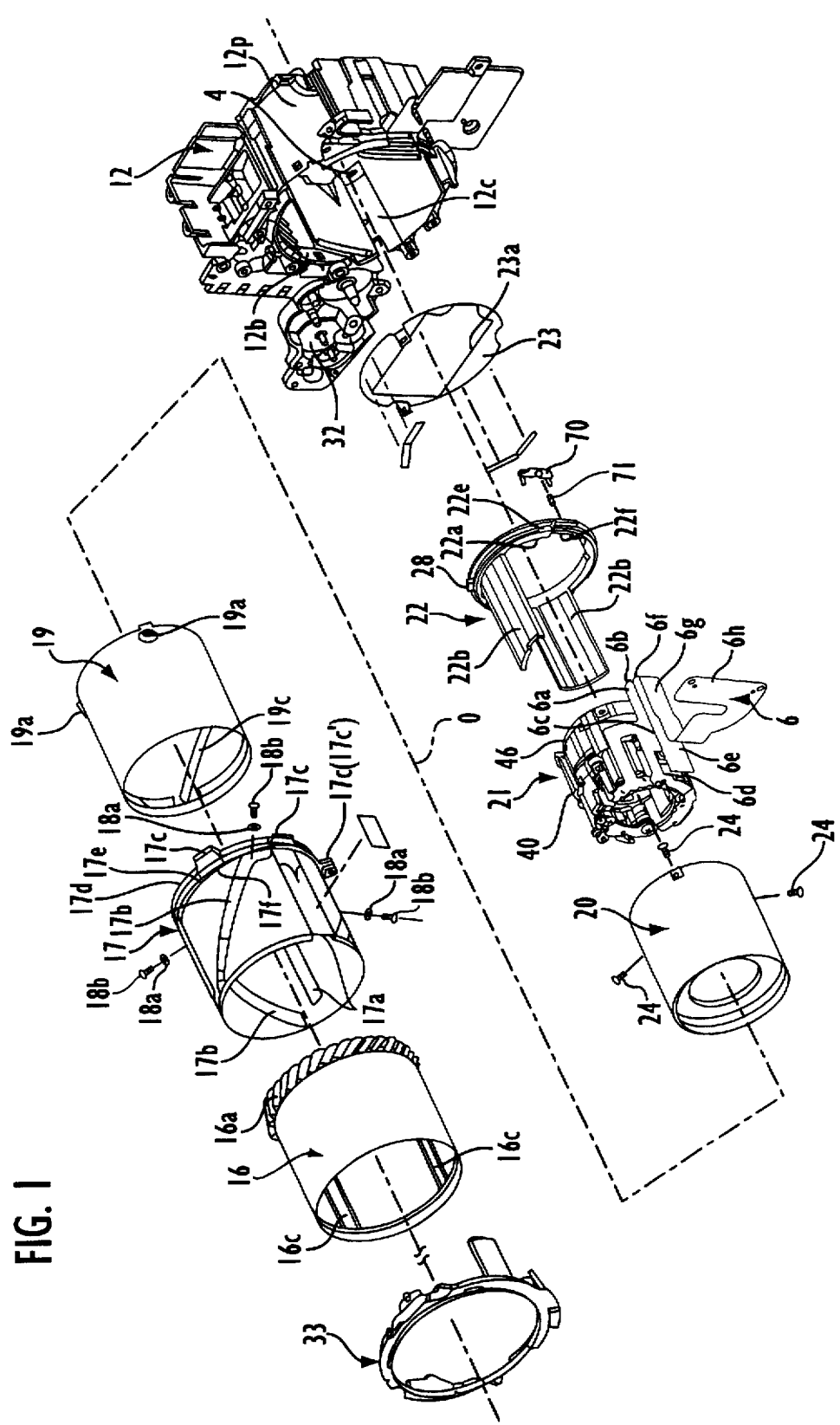
FIG. 1 is an exploded perspective view of a part of a zoom lens barrel.
Figure 2:
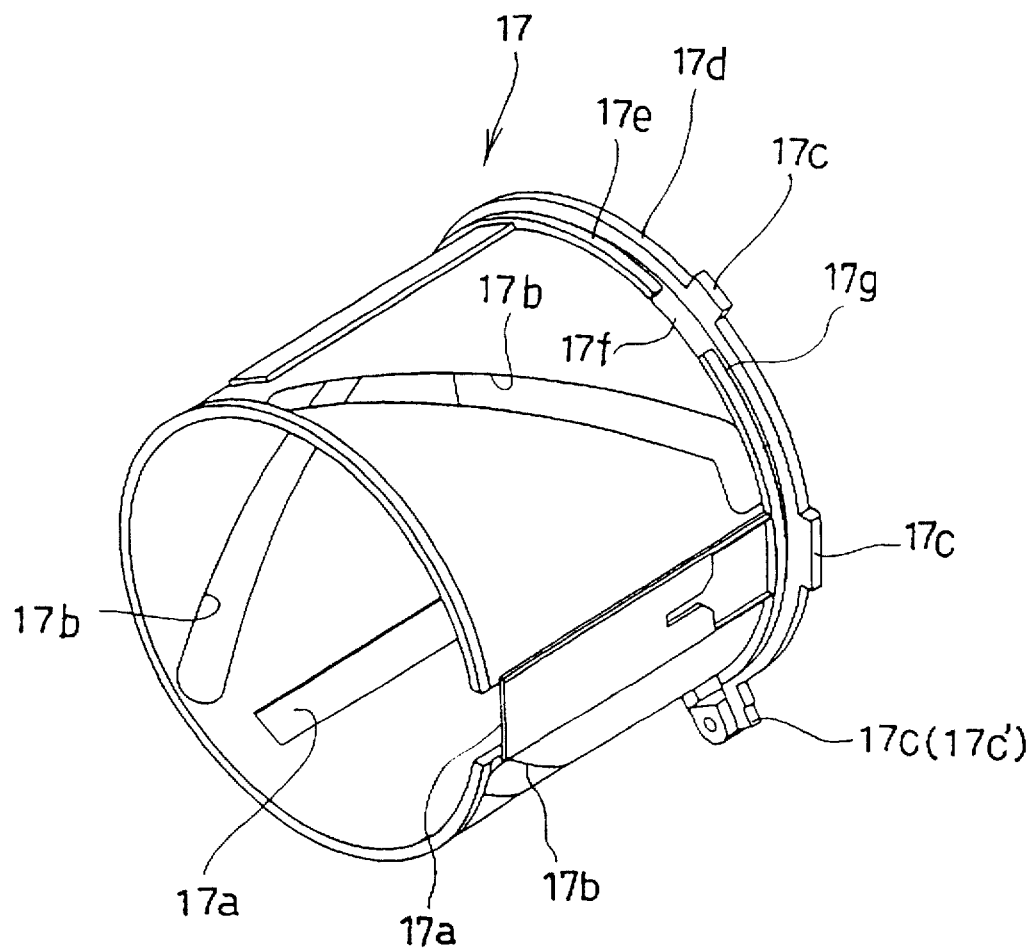
FIG. 2 is an enlarged perspective view of a linear guide barrel of the zoom lens barrel shown in FIG. 1.

As shown in FIG. 2, the linear guide barrel 17 is provided, on a rear part of an outer periphery thereof, with a rear end flange 17d. The rear end flange 17d has a plurality of engaging projections 17c each projecting away from the optical axis 0 in a radial direction. The linear guide barrel 17 is further provided with a retaining flange 17e in front of the rear end flange 17d. A circumferential groove 17g is formed between the rear end flange 17d and the retaining flange 17e. The retaining flange 17e has a radius smaller than the rear end flange 17d. The retaining flange 17e is provided with a plurality of cutout portions 17f. Each of the cutout portions 17f allows a corresponding engaging projection 16d to be inserted into the circumferential groove 17g, as shown in FIG. 17.

The third moving barrel 16 is provided, on an inner periphery of the rear end thereof, with a plurality of engaging projections 16d. Each of the engaging projections 16d projects towards the optical axis 0 in a radial direction. By inserting the engaging projections 16d into the circumferential groove 17g, through the corresponding cutout portions 17f, the engaging projections 16d are positioned in the circumferential groove 17g between the flanges 17d and 17e (see FIG. 17). By rotating the third moving barrel 16 relative to the linear guide barrel 17, the engaging projections 16d are engaged with the linear guide barrel 17.

An aperture plate 23 having a rectangular-shaped aperture 23a approximately the same shape as the aperture 14a is fixed to the read-end of the linear guide barrel 17.

The relative rotation of the linear guide barrel 17, with respect to the fixed lens barrel block 12, is restricted by the slidable engagement of the plurality of engaging projections 17c with the corresponding linear guide grooves 12b, formed parallel to the optical axis 0.

A contacting terminal 9 is fixed to one of the engaging projections 17c, namely 17c'. The contacting terminal 9 is in slidable contact with the code plate 13a, fixed to the bottom of the linear guide groove 12b' to generate signals corresponding to focal length information during zooming.

Figure 3:
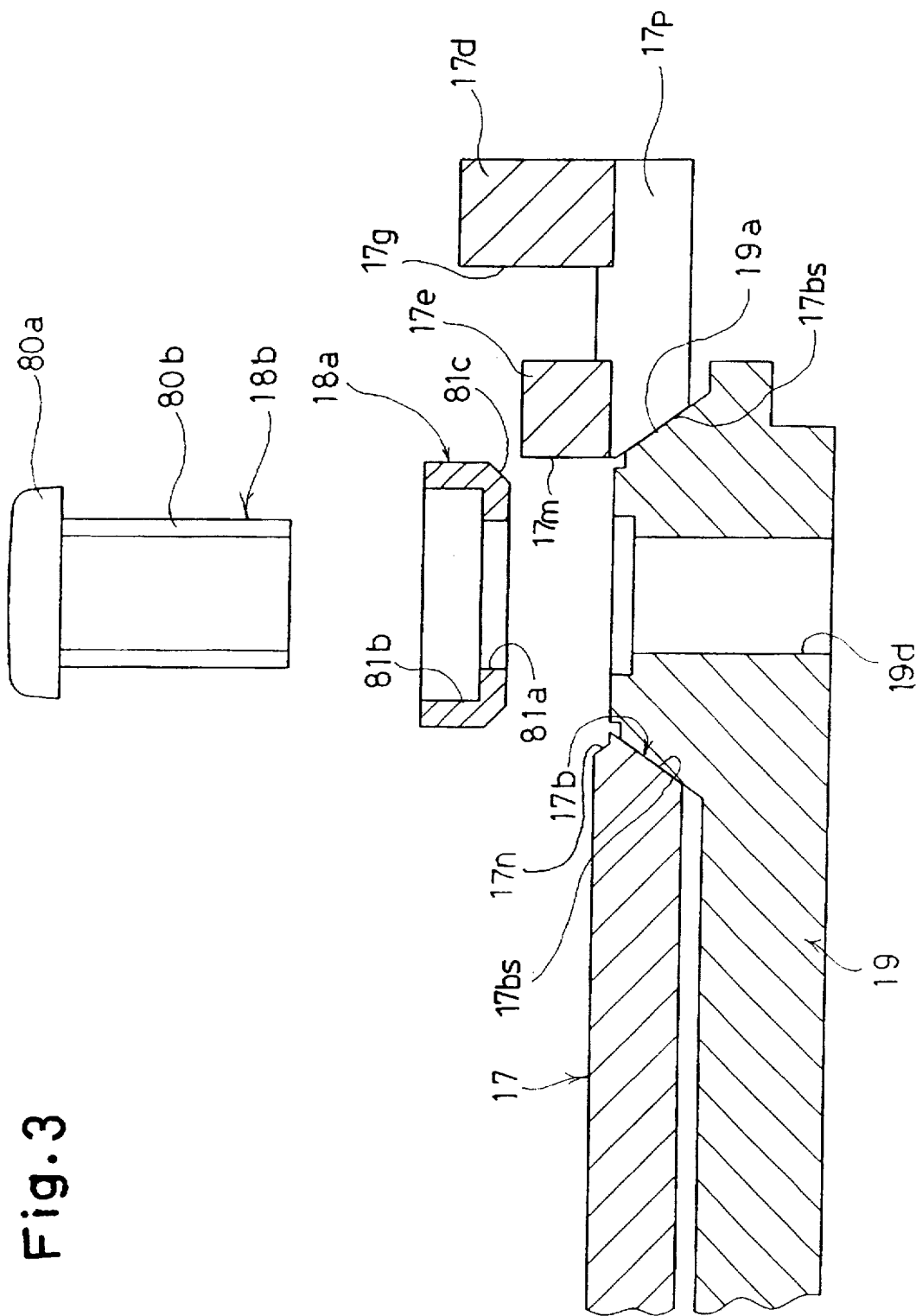
FIG. 3 is an exploded sectional view of a part of the zoom lens barrel.
Figure 4:
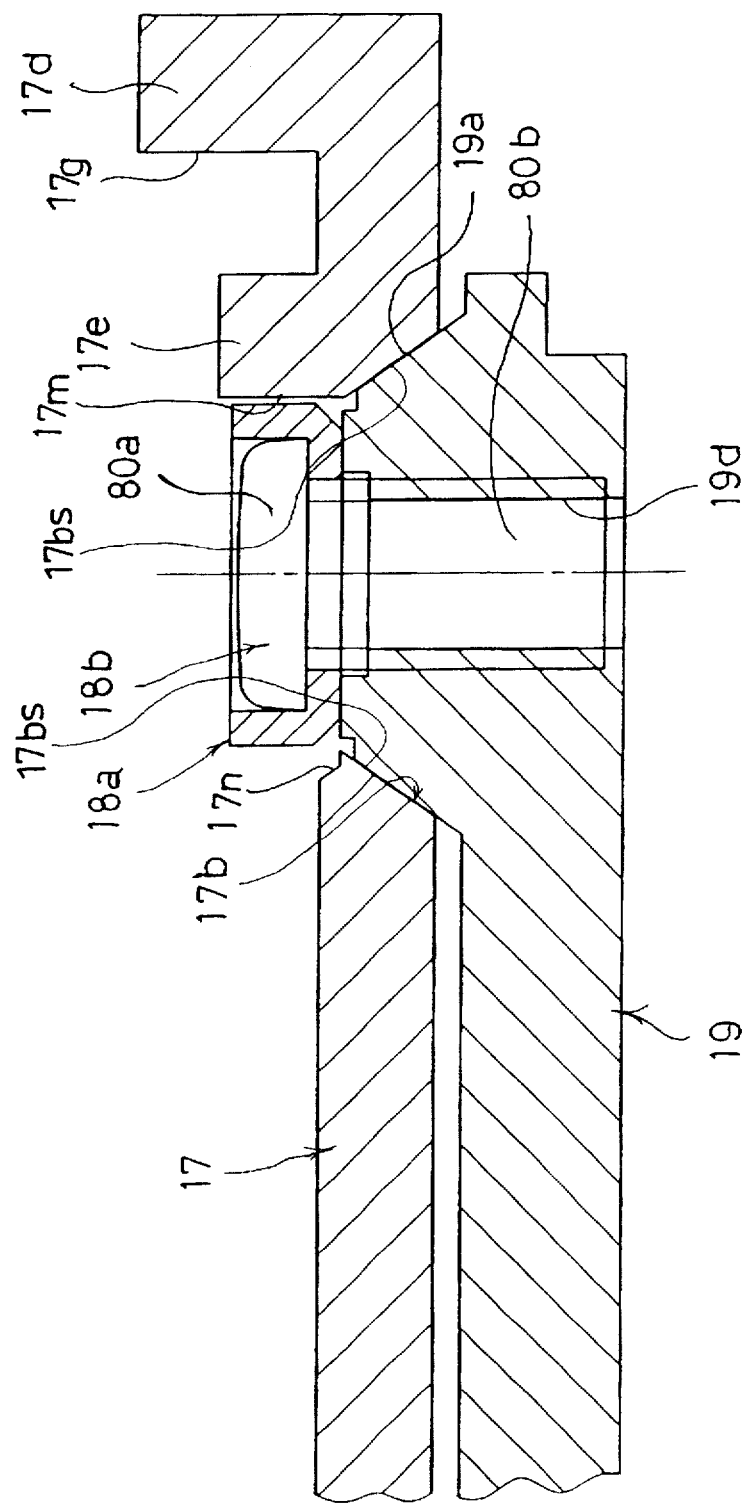
FIG. 4 is a sectional view of the part of the zoom lens barrel shown in FIG. 3 is an assembled state.
Figure 5:
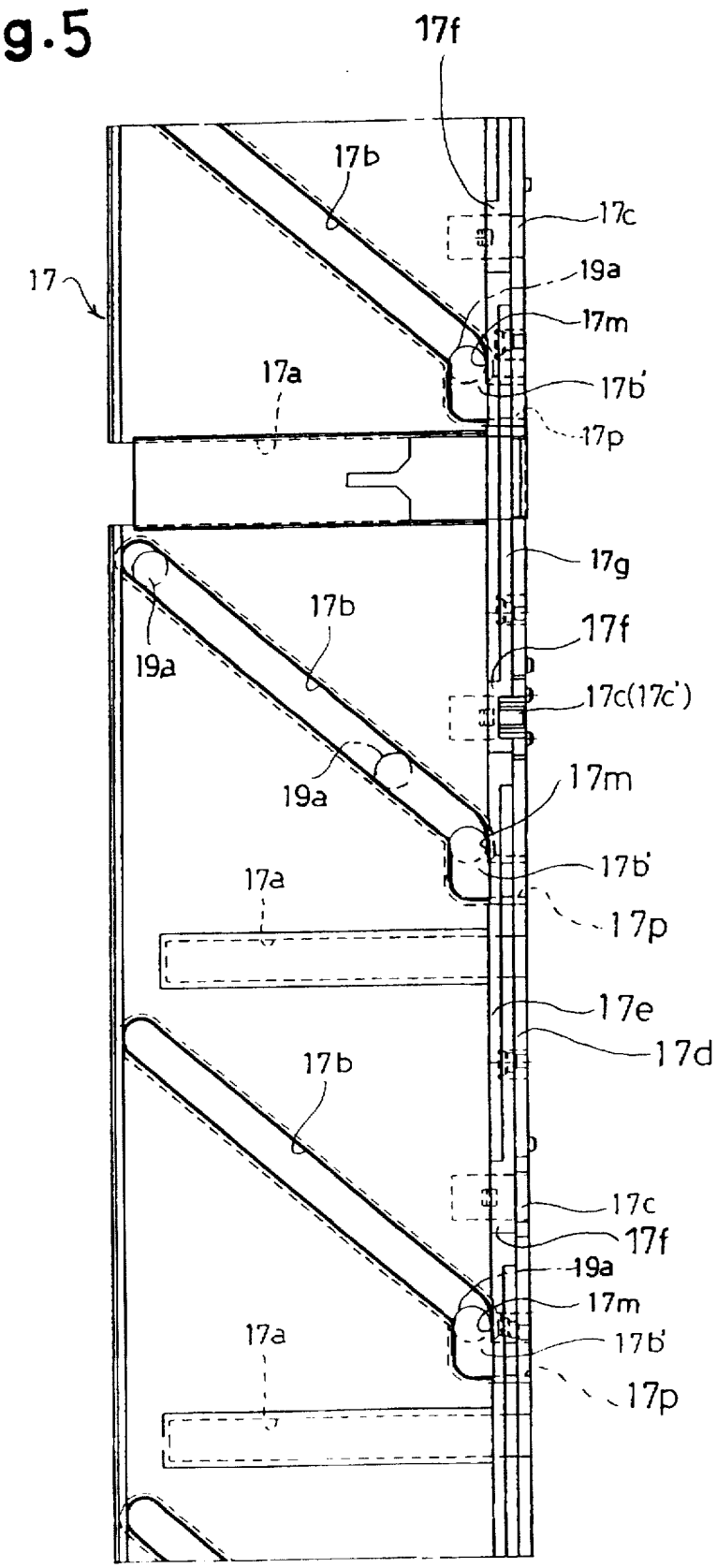
FIG. 5 is a developed view of the outer periphery of the linear guide barrel shown in FIG. 2.

A plurality of linear guide grooves 17a are formed on the inner periphery of the linear guide barrel 17, each extending parallel to the optical axis 0. A plurality of lead slots (cam slots) 17b are also formed on the linear guide barrel 17 as shown in FIGS. 2 or 18. The lead slots 17b are each formed oblique (inclined) to the optical axis 0. The linear guide barrel 17 may be provided, for example, with three linear guide grooves 17a and three lead slots 17b. More specifically, the lead slots 17b extend parallel to one another as shown in FIG. 5 and each lead slot 17b is oblique to both the optical axis direction (horizontal direction as viewed in FIG. 5) and a circumferential direction of the linear guide barrel 17 (vertical direction as viewed in FIG. 5) by a predetermined angle. Furthermore, each lead slot 17b is formed such that a cross-section along a plane perpendicular to a longitudinal direction thereof tapers in a direction away from a corresponding follower projection 19a, i.e., away from the optical axis 0, to correspond to the shape of the corresponding follower projection 19a. In other words, each lead slot 17b is formed such that side surfaces 17bs of each lead slot 17b, with which the corresponding follower projection 19a slidably contacts, approach each other in the direction away from the corresponding follower projection 19a. A cross-sectional shape of each lead slot 17b along a plane perpendicular to a longitudinal direction thereof is accordingly trapezoidal corresponding to the shape of the corresponding follower projection 19a, as can be seen in FIGS. 3 or 4.

The second moving barrel 19 engages with the inner periphery of the linear guide barrel 17. On the inner periphery of the second moving barrel 19, a plurality of lead grooves 19c are provided in a direction inclined oppositely to the lead slots 17b. Each lead groove 19c is oblique to both the optical axis direction and a circumferential direction of the linear guide barrel 17 by a predetermined angle, similar to each lead slot 17b. On the outer periphery of the rear end of the second moving barrel 19, a plurality of follower projections 19a are provided. Each of the follower projections 19a has a trapezoidal cross-sectional shape projecting away from the optical axis 0 in a radial direction. The trapezoidal cross-sectional shape corresponds to that of the corresponding lead slot 17b so that each follower projection 18a can firmly and slidably contact the side surfaces 17bs of the corresponding lead slot 17b. The second moving barrel 19 is molded using a synthetic resin, specifically, a polycarbonate containing 20 percent glass fibers, and the follower projections 19a are integrally formed on the second moving barrel 19. The second moving barrel 19 may be formed from other types of synthetic resins. The linear guide barrel 17 is also molded using a polycarbonate containing 20 percent glass fibers, but may be formed from other types of synthetic resins. Follower pins 18 are positioned in the follower projections 19a. Each follower pin 18 consists of a ring member 18a, and a center fixing screw 18b which supports the ring member 18a on the corresponding follower projection 19a. The follower projections 19a are in slidable engagement with the lead slots 17b of the linear guide barrel 17, and the follower pins 18 are in slidable engagement with the linear guide grooves 16c of the third moving barrel 16. With such an arrangement, when the third moving barrel 16 rotates, the second moving barrel 19 moves linearly in the optical axis direction, while rotating.

On the inner periphery of the second moving barrel 19, the first moving barrel 20 is engaged. The first moving barrel 20 is provided on an outer periphery of the rear thereof with a plurality of follower pins 24 each engaging with the corresponding inner lead groove 19c. At the same time the first moving barrel 20 is guided linearly by a linear guide member 22. The first moving barrel 20 is provided at the front end thereof with a decorative plate 41.

Figure 7:
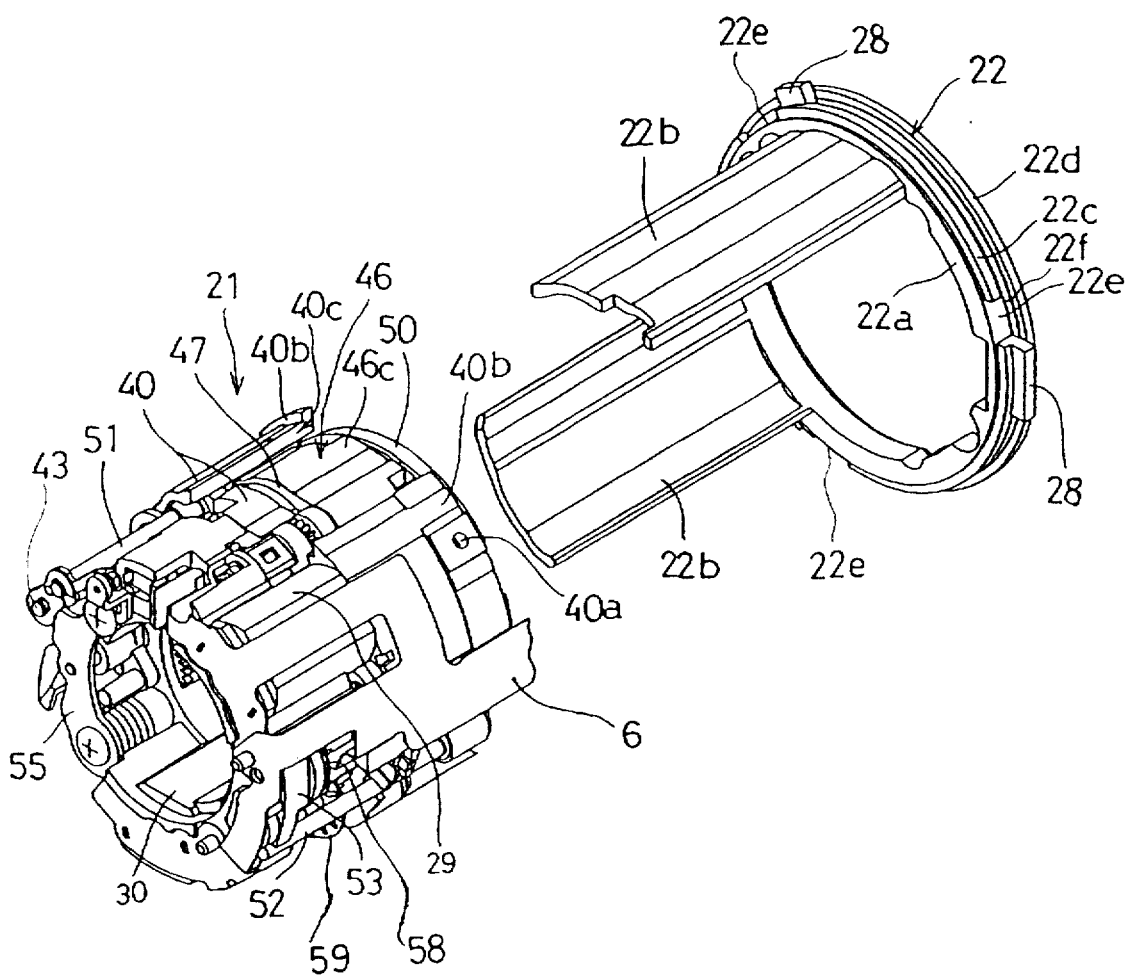
FIG. 7 is an enlarged schematic perspective view showing a part of the zoom lens barrel.
Figure 8:
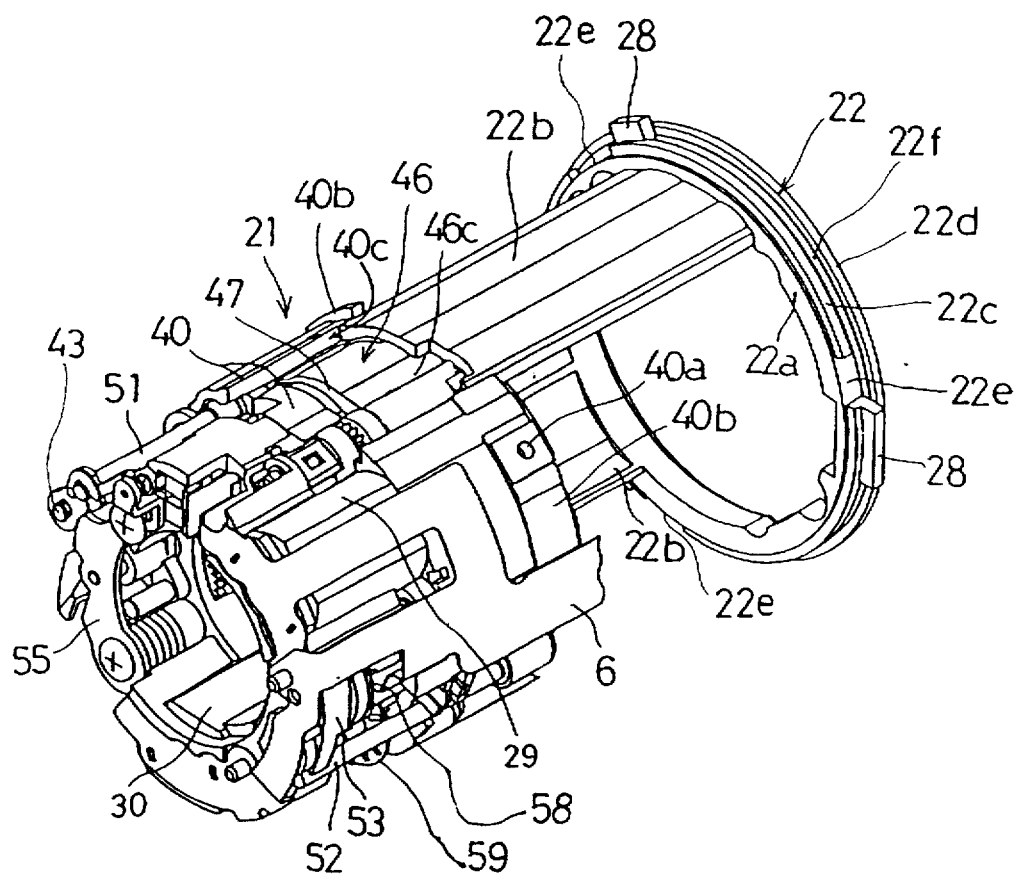
FIG. 8 is a schematic perspective view showing the part of the zoom lens barrel shown in FIG. 7 in an engaged state.
Figure 9:
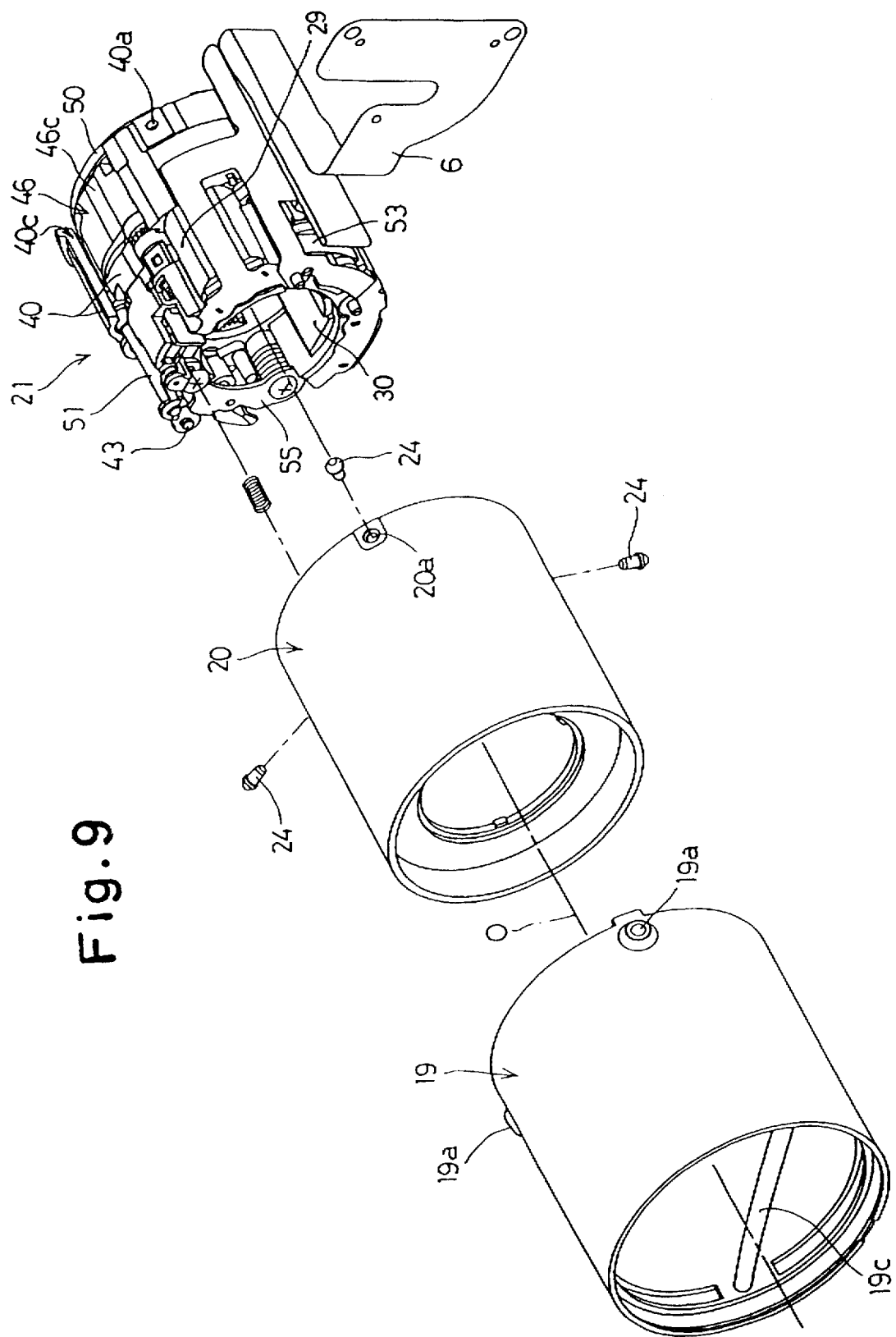
FIG. 9 is an enlarged exploded perspective view of a part of the zoom lens barrel.

As shown in FIGS. 7 and 8, the linear guide member 22 is provided with an annular member 22a, a pair of guide legs 22b and a plurality of engaging projections 28. The pair of guide legs 22b project from the annular member 22a in the optical axis direction. The plurality of engaging projections 28 each project from the annular member 22a away from the optical axis 0 in a radial direction. The engaging projections 28 slidably engage with the linear guide grooves 17a. The guide legs 22b are respectively inserted into linear guides 40c between the inner peripheral surface of the first moving barrel 20 and the AF/AE shutter unit 21.

The annular member 22a of the linear guide member 22 is connected to the rear of the second moving barrel 19, such that the linear guide member 22 and the second moving barrel 19 are capable of moving along the optical axis 0 as a whole and relatively rotating around the optical axis 0. The linear guide member 22 is further provided on the outer periphery of the rear end thereof with a rear end flange 22d. The linear guide member 22 is further provided in front of the rear end flange 22d with a retaining flange 22c. A circumferential groove 22f is formed between the rear end flange 22d and the retaining flange 22c. The retaining flange 22c has a smaller radius than the rear end flange 22d. The retaining flange 22c is provided with a plurality of cutout portions 22e, as shown in FIGS. 7 or 8, each allowing a corresponding engaging projection 19b to be inserted into the circumferential groove 22f, as shown in FIG. 17.

The second moving barrel 19 is provided on an inner periphery of the rear end thereof with a plurality of engaging projections 19b, each projecting towards the optical axis 0 in a radial direction. By inserting the engaging projections 19b into the circumferential groove 22f through the corresponding cutout portions 22e, the engaging projections 19b are positioned in the circumferential groove 22f between the flanges 22c and 22d. By rotating the second moving barrel 19 relative to the linear guide member 22, the engaging projections 19b are engaged with the linear guide member 22. With the above structure, when the second moving barrel 19 rotates in the forward or reverse rotational direction, the first moving barrel 20 moves linearly forwardly or rearwardly along the optical axis 0, but is restricted from rotating.

Figure 15:
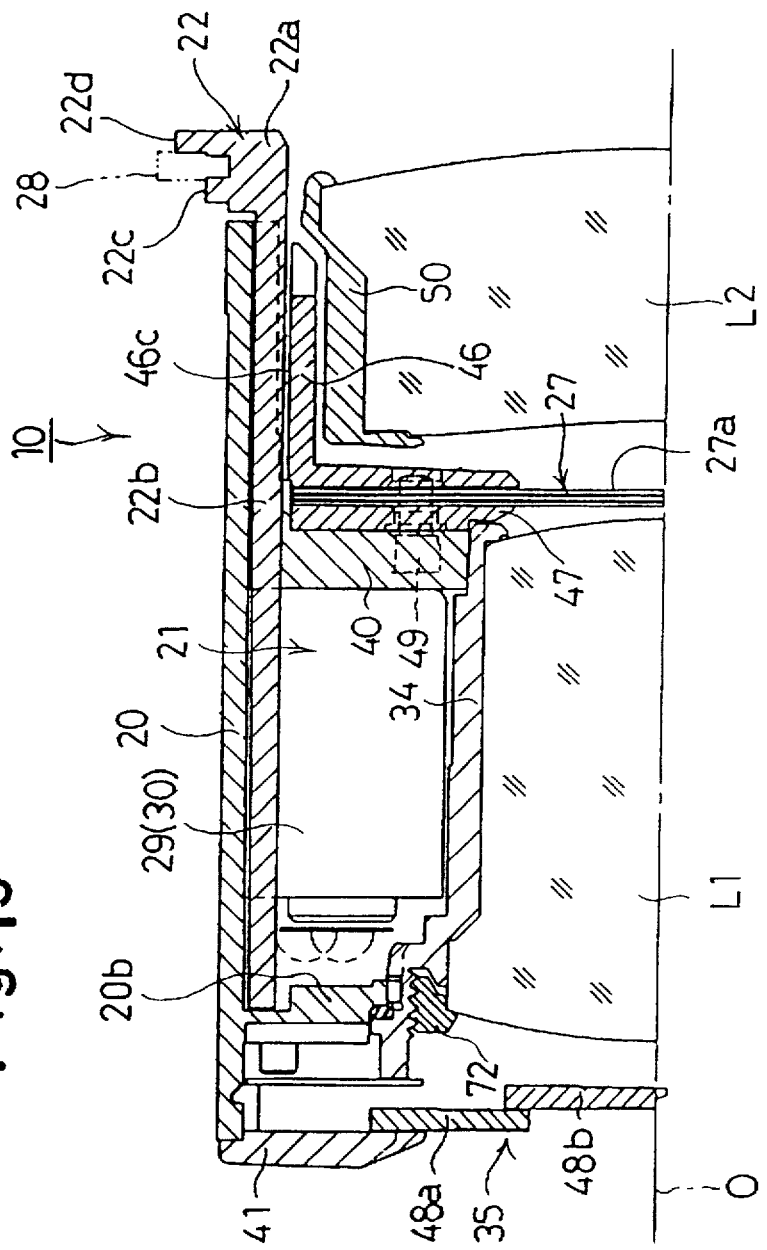
FIG. 15 is a sectional view of an upper part of the zoom lens barrel, illustrating essential elements in a housed state.

At the front of the first moving barrel 20, a barrier apparatus 35 having barrier blades 48a and 48b is mounted. On an inner peripheral face of the first moving barrel 20, the AF/AE shutter unit 21 having the shutter 27, consisting of three shutter blades 27a, is engaged and fixed as shown in FIG. 15. The AF/AE shutter unit 21 is provided with a plurality of fixing holes 40a formed at even angular intervals on the outer periphery of the shutter mounting stage 40. Only one of the fixing holes 40a appears in each of FIGS. 7–11.

Figure 10:
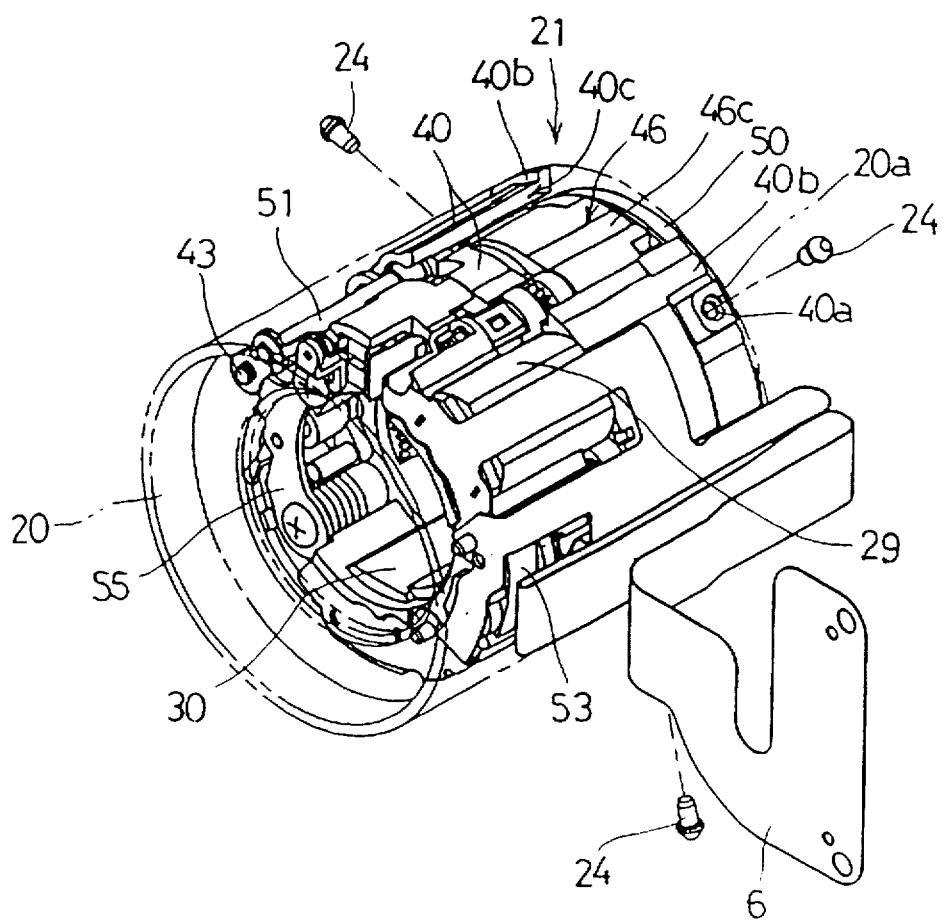
FIG. 10 is a schematic perspective view illustrating a state where an AF/AE shutter unit of the zoom lens barrel is mounted to a first moving barrel.

The aforementioned plurality of follower pins 24, which engage with the inner lead grooves 19c, also serve as a device for fixing the AF/AE shutter unit 21 to the first moving barrel 20. The follower pins 24 are inserted in holes 20a, formed on the first moving barrel 20, and fixed in the fixing holes 40a. With this arrangement the AF/AE shutter unit 21 is secured to the first moving barrel 20 as shown in FIG. 10. In FIG. 10 the first moving barrel 20 is indicated by phantom lines. The follower pins 24 may be fixed by an adhesive, or the pins 24 may be formed as screws to be screwed into the fixing holes 40a.

Figure 11:
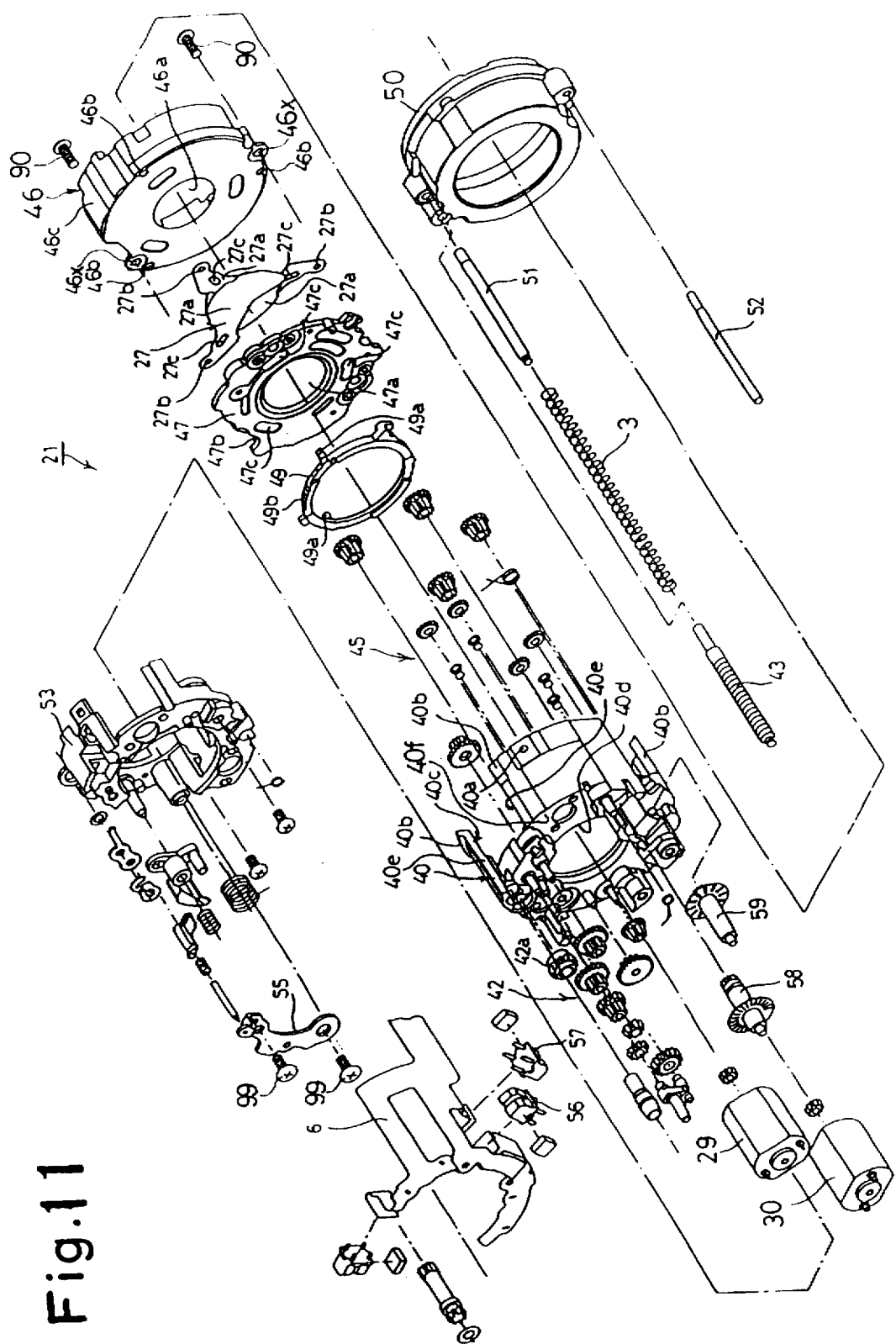
FIG. 11 is an exploded perspective view illustrating main parts of the AF/AE shutter unit of the zoom lens barrel shown in FIGS. 7–10.

As illustrated in FIGS. 11 and 18, the AF/AE shutter unit 21 is provided with the shutter mounting state 40, a shutter blade supporting ring 46 fixed on the rear of the shutter mounting stage 40 so as to be located inside the shutter mounting stage 40, and the lens supporting barrel 50 supported in a state of being capable of movement relative to the shutter mounting stage 40. The shutter mounting stage 40 supports the lens supporting barrel 34, the AE motor 29, and the rear lens group driving motor 30. The shutter mounting stage 40 is provided with an annular member 40f having a circular aperture 40d. The shutter mounting stage 40 is also provided with three legs 40b which project rearward from the annular member 40f. Three slits are defined between the three legs 40b. Two of the slits comprise the aforementioned linear guides 40c, which slidably engage with the respective pair of guide legs 22b of the linear guide member 22 so as to guide the movement of the linear guide member 22.

The shutter mounting stage 40 supports an AE gear train 45 which transmits a rotation of the AE motor 29 to the shutter 27, a lens driving gear train 42 which transmits rotation of the rear lens group driving motor 30 to a screw shaft 43, photointerrupters 56 and 57 which are connected to a flexible printed circuit board 6, and rotating disks 58 and 59 which have a plurality of radially formed slits provided in the circumferential direction. An encoder for detecting whether the rear lens group driving motor 30 is rotating and for detecting an amount of rotation of the rear lens group driving motor 30 consists of the photointerrupter 57 and the rotating disk 59. An AE motor encoder for detecting whether the AE motor 29 is rotating and for detecting an amount of rotation of the AE motor 29 consists of the photointerrupter 56 and the rotating disk 58.

The shutter 27, a supporting member 47 which pivotally supports the three shutter blades 27a of the shutter 27, and a circular driving member 49, which gives rotative power to the shutter blades 27a, are positioned between the shutter mounting stage 40 and the shutter blade supporting ring 46, secured to the shutter mounting stage 40. The circular driving member 49 is provided with three operating projections 49a at even angular intervals, which respectively engage with each of the three shutter blades 27a. As shown in FIG. 11, the front end of the shutter blade supporting ring 46 is provided with a circular aperture 46a and with three supporting holes 46b positioned at even angular intervals around the circular aperture 46a. Two deflection restricting surfaces 46c are formed on the outer periphery of the shutter blade supporting ring 46. Each deflection restricting surface 46c is exposed outwardly from the corresponding linear guide 40c and slidably supports the inner peripheral face of the corresponding guide leg 22b.

The supporting member 47, positioned in front of the shutter blade supporting ring 46, is provided with a circular aperture 47a aligned with the circular aperture 46a of the shutter blade supporting ring 46, and with three pivotal shafts 47b (only one of which is illustrated in FIG. 11) at respective positions opposite the three supporting holes 46b. Each shutter blade 27a is provided at one end thereof with a hole 27b into which the corresponding pivotal shaft 47b is inserted, so that each shutter blade 27a is rotatable about the corresponding pivotal shaft 47b. The major part of each shutter blade 27a that extends normal to the optical axis 0 from the pivoted end is formed as a light interceptive portion. The three light interceptive portions of the shutter blades 27a together prevent ambient light, which enters the front lens group L1, from entering the circular apertures 46a and 47a when closed. Each shutter blade 27a is further provided between the hole 27b and the light interceptive portion thereof with a slot 27c, through which the corresponding operating projection 49a is inserted. The supporting member 47 is fixed to the shutter blade supporting ring 46 in such a manner that each shaft 47b which supports the corresponding shutter blade 27a is engaged with the corresponding supporting hole 46b of the shutter blade supporting ring 46.

A gear portion 49b is formed on a portion of the outer periphery of the circular driving member 49. The gear portion 49b meshes with one of the plurality of gears in the gear train 45 to receive the rotation from the gear train 45. The supporting member 47 is provided, at respective positions close to the three pivotal shafts 47b, with three arc grooves 47c each arched along a circumferential direction. The three operating projections 49a of the circular driving ring 49 engage with the slots 27c of the respective shutter blades 27a through the respective arc grooves 47c. The shutter blade supporting ring 46 is inserted from the rear of the shutter mounting stage 40, to support the circular driving ring 49, the supporting member 47 and the shutter 27, and is fixed on the shutter mounting stage 40 by set screws 90 respectively inserted through holes 46x provided on the shutter blade supporting ring 46.

The lens supporting barrel 50 is positioned behind the shutter blade supporting ring 46 and supported to be movable relative to the shutter mounting stage 40 via guide shafts 51 and 52. The shutter mounting stage 40 and the lens supporting barrel 50 are biased in opposite directions (i.e., away from each other) by a coil spring 3 fitted on the guide shaft 51, and therefore play between the shutter mounting stage 40 and the lens supporting barrel 50 is reduced. In addition, a driving gear 42a, provided as one of the gears in the gear train 42, is provided with a female thread hole (not shown) at the axial center thereof and is restricted to move in the axial direction. The screw shaft 43, one end of which is fixed to the lens supporting barrel 50, engages with the female thread hole. Accordingly, the driving gear 42a and the screw shaft 43 together constitute a feed screw mechanism. In such a manner, when the driving gear 42a rotates forwardly or reversely due to driving by the rear lens group driving motor 30, the screw shaft 43 respectively moves forwardly or rearwardly with respect to the driving gear 42a. Therefore, the lens supporting barrel 50, which supports the rear lens group L2, moves relative to the front lens group L1.

A holding member 53 is fixed at the front of the shutter mounting stage 40. The holding member 53 holds the motors 29 and 30 between the holding member 53 and the shutter mounting stage 40. The holding member 53 has a metal holding plate 55 fixed at the front thereof by set screws 99. The motors 29, 30 and the photointerrupters 56, 57 are connected to the flexible printed circuit board 6. One end of the flexible printed circuit board 6 is fixed to the shutter mounting stage 40.

After the first, second and third moving barrels 20, 19 and 16, and the AF/AE shutter unit 21, etc. are assembled, the aperture plate 23 is fixed to the rear of the linear guide barrel 17, and an annular retaining member 33 is fixed at the front of the fixed lens barrel block 12.

In the zoom lens barrel 10 there is provided a mechanism for preventing damage to the zoom lens barrel 10 when a strong impact is applied to the front end of the zoom lens barrel 10 in a direction of retraction thereof, if the first through third moving barrels 20, 19 and 16 are fully retracted in the fixed lens barrel block 12. Such a mechanism will be hereinafter discussed with reference to mainly FIGS. 1–6.

The mechanism for preventing damage to the zoom lens barrel 10 may be realized by the third moving barrel 16, the linear guide barrel 17 and the second moving barrel 19.

As shown in FIGS. 3 or 4, each of the plurality of ring members 18a is provided with a circular recess 81b. A head 80a of the corresponding center fixing screw 18b is seated on the circular recess 81b. A central hole 81a is formed at the center of the bottom of the circular recess 81b, through which a threaded shaft 80b of the corresponding center fixing screw 18b is inserted. A screw hole 19d is formed on the second moving barrel 19 on each follower projection 19a. The thread shafts 80b are respectively secured to the screw holes 19d. The bottom edge of each ring member 18a is tapered toward the second moving barrel 19 in a radial direction thereof, so that each ring member 18a is provided at a bottom edge thereof with a tapered surface 81c. The linear guide barrel 17 is provided, along an outer edge of each lead slot 17b, with a tapered lead surface 17n, which is formed oblique by a predetermined angle to firmly contact the tapered surface 81c of the corresponding ring member 18a. As can be seen from FIGS. 3, 4 and 6, a rearmost outer edge of each lead slot 17b, which extends along and is adjacent to the retaining flange 17e, is not formed as the tapered lead surface 17n.

The linear guide barrel 17 is provided, on the front surface of the retaining flange 17e, with a plurality of bumper surfaces 17m. Each of the bumper surfaces 17m is positioned to correspond to the rear end of the corresponding lead slot 17b. The ring members 18a respectively bump against the bumper surface 17m when the second moving barrel 19 is driven to move back to its fully-retracted position relative to the linear guide barrel 17, that is, when the zoom lens barrel 10 retracts to the retracted position thereof. Each lead slot 17b is provided, at a rear end thereof, with an end slot 17b' (FIG. 5) which extends in a circumferential direction of the linear guide barrel 17 and extends along and is adjacent to the retaining flange 17e.

A lead groove 17p for the corresponding follower projection 19a which is inserted into the corresponding lead slot 17b during an assembly of the zoom lens barrel 10, is formed on an inner periphery of the rear end of the linear guide barrel 17 at the rear end of each lead slot 17b. During assembly of the zoom lens barrel 10, when the second moving barrel 19 is fitted in the linear guide barrel 17, firstly the second moving barrel 19 is inserted into the linear guide barrel 17 from the rear end thereof, and subsequently, the follower projections 19a are respectively inserted into the lead slots 17b through the lead grooves 17p. Thereafter, the ring members 18a are respectively secured onto the follower projections 19a by the center fixing screws 18b. Therefore, once the second moving barrel 19 and the linear guide barrel 17 are assembled, the second moving barrel 19 cannot be taken out of the linear guide barrel 19 from the rear end thereof, since the ring members 18a bump against the bumper surfaces 17m when the second moving barrel 19 is moved to its fully-retracted position relative to the linear guide barrel 17. Therefore, the bumper surfaces 17m function as stoppers to prevent the second moving barrel 19 from coming out of the linear guide barrel 17 from a rear end thereof.

The ring members 18a respectively and slidably fit in the linear guide grooves 16c as noted above, while the follower projections 19a respectively and slidably fit in the lead slots 17b. Accordingly, when the third moving barrel 17 moves along the optical axis 0 while rotating about the optical axis 0 relative to the fixed lens barrel block 12, the second moving barrel 19 moves along the optical axis 0 relative to the third moving barrel 16 while rotating together with the third moving barrel 16 in the same rotational direction relative to the fixed lens barrel block 12.

The lead slots 17b are formed as linear grooves, each of which is formed at a predetermined oblique angle to both the optical axis direction and a circumferential direction of the linear guide barrel 17 as noted above, so that the follower pins 18 are driven to move in the optical axis direction at a constant speed when the third moving barrel 16 is driven to rotate at a constant rotational speed. However, each lead slot 17b is regarded as a particular type of cam slot for moving the corresponding follower pin 18 in the optical axis direction at a speed having no variation when the third moving barrel 16 is driven to rotate at a constant rotational speed. Therefore, the lead slots 17b may be considered to be cam slots formed on the linear guide barrel 17.

Figure 6:
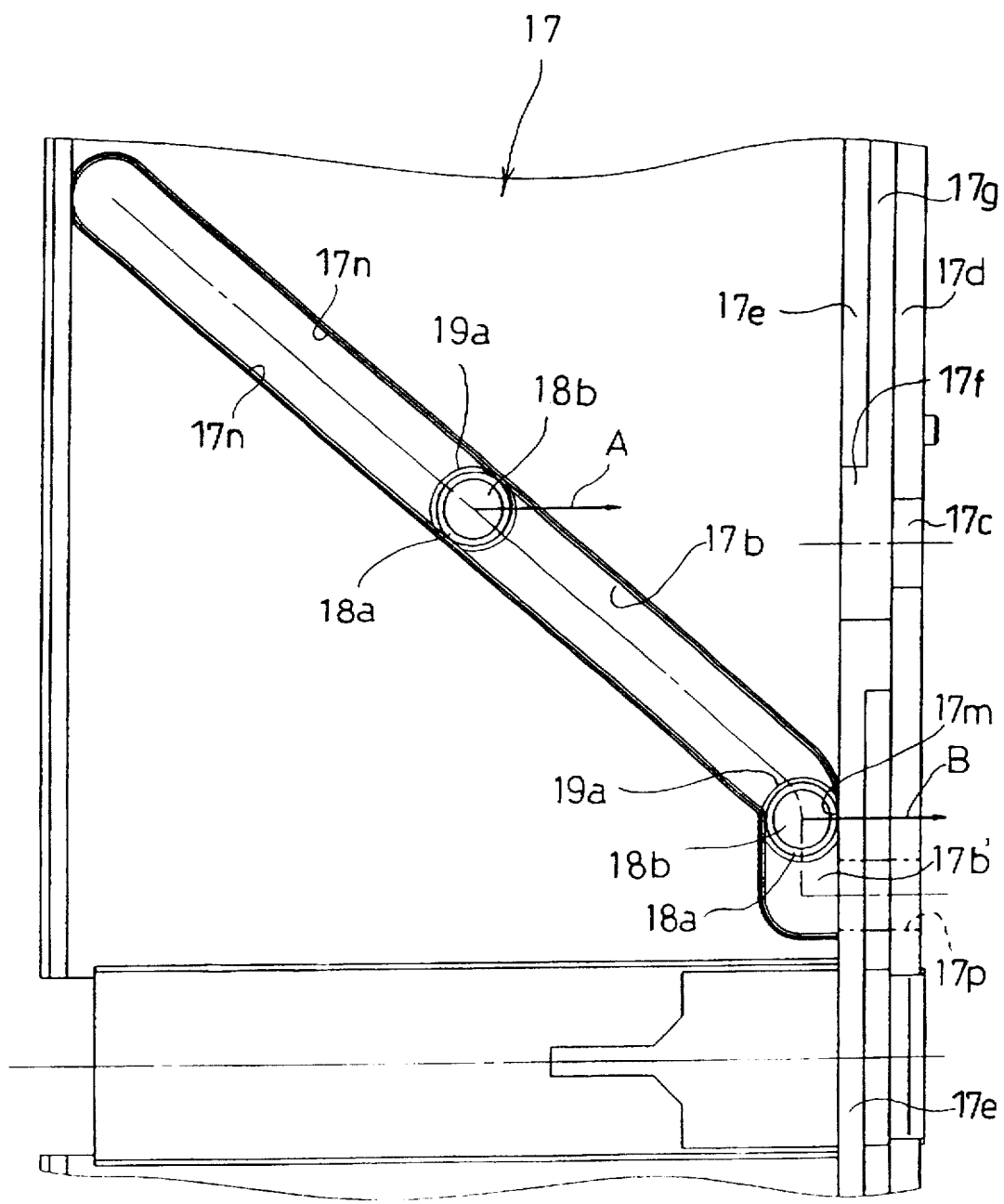
FIG. 6 is an enlarged view of a part of the developed view shown in FIG. 5.

Generally, when an impact is applied to the front end of a telescoping type of zoom lens in a direction of retraction thereof while the zoom lens is advanced from a camera body, the impact will be absorbed by a clutch, helicoids, cam slots, cam grooves or the like, provided in the zoom lens, without the occurrence of any damage, in the case where the lead of the helicoids, cam slots, cam grooves or the like is small. An arrow "A" shown in FIG. 6 represents a direction of such an impact. However, when a strong impact is applied to the front end of the telescoping type of zoom lens barrel in a direction of retraction thereof while the zoom lens barrel is fully retracted, the helicoids, cam slots, cam grooves and/or peripheral members in the zoom lens may be damaged, particularly in the case where the lead of the helicoids, cam slots, cam grooves or the like is large. However, the zoom lens barrel 10 of the present embodiment does not easily suffer from such a problem. In the zoom lens barrel 10, in the case when an impact is applied to the front end of the zoom lens barrel 10 in a direction of retraction thereof when the first through third moving barrels 20, 19 and 16 are fully retracted into the fixed lens barrel block 12, i.e., with the follower pins 18 being respectively located at the end slots 17b' of the lead slots 17b as shown in FIG. 6, the impact is received by the end slots 17b' of the lead slots 17b through the follower projections 19a and by the retaining flange 17e at the bumper surfaces 17m through the ring members 18a.

An arrow "B" shown in FIG. 6 represents a direction of the impact applied to the retaining flange 17e through one of the ring members 18a. If the impact were received by the rear ends of the lead slots 17b through the follower projections 19a, the rear ends of the lead slots 17b would be damaged and/or the follower pins 18 and the follower projections 19a would run-off the lead slots 17b, which may cause damage to the zoom lens barrel 10. However, since the impact is received by the end slots 17b' through the follower projections 19a and the retaining flange 17e, whose strength is sufficiently strong, through the ring members 18a, the zoom lens barrel is not damaged.

In the zoom lens barrel 10 a cam mechanism is provided for producing a predetermined movement between two concentrically arranged moving barrels (e.g., the second and third barrels 16, 19). The cam mechanism includes the linear guide barrel 17, the follower projections 19a of the second moving barrel 19, the follower pins 18, the linear guide grooves 16c of the third moving barrel 16, etc.

The linear guide barrel 17 and the second moving barrel 19 are assembled in the following manner. The second moving barrel 19 is inserted into the linear guide barrel 17 from the rear end thereof while each of the follower projections 19a is inserted into a corresponding one of the lead grooves 17p. Thereafter, each of the ring members 18a is placed on the top of a corresponding one of the follower projections 19a, which comes out of the corresponding lead slot 17b. Subsequently, each ring member 18a is secured to the corresponding follower projection 19a by screwing the fixing screw 18 in the screw hole 19d. In this state, the second moving barrel 19 cannot be taken out of the linear guide barrel 17 from the rear end thereof since the ring members 18a respectively contact the bumper surfaces 17m when the second moving barrel is in a most retracted state relative to the linear guide barrel 17.

In the case where each of the lead slots 17b is formed as a conventional lead slot (i.e., a lead slot whose side surfaces extend parallel to each other and do not approach each other in a direction away from the corresponding follower projection 19a), and in the case where each of the followers which engage with a corresponding one of such conventional lead slots and a corresponding one of the linear guide grooves 16c, is integrally formed as a single follower on the second moving barrel 19 (i.e., not as a combination of the follower projection 19a and the ring member 18a), a complicated mold structure is used for molding the linear guide barrel 17 which may comprise a plurality of mold pieces. In addition, in the case where the aforementioned single follower is integrally formed on the second moving barrel 19, instead of the combination of the follower projection 19a and the ring member 18a, each lead groove 17p is provided as a lead slot which penetrates completely through the linear guide barrel 17 in a radial direction thereof, because each single follower will be much longer than the thickness of the linear guide barrel 17 in the radial direction. This structure lessens the strength of the linear guide barrel at a rear portion thereof. In this case, if such a strength needs to be maintained, the linear guide barrel 10 must be formed having a thicker rear portion, which results in increasing the size of the zoom lens barrel 10.

However, according to the zoom lens barrel 10 of the present embodiment, such a problem is avoided due to the aforementioned structure in which the ring members 18a are respectively fixed during assembly to the follower projection 19a after the second moving barrel 19 has been inserted in the linear guide barrel 17. In addition, since the ring members 18a and the follower projections 19a are separately formed and since each follower projection 19a is tapered in a direction away from the optical axis 0, a mold used for molding the linear guide barrel 17 can be formed having a simple structure.

In the above-described embodiment of the zoom lens barrel 10, although the zoom lens optical system consists of two movable lens groups (i.e., the front lens group L1 and the rear lens group L2), it should be understood that the present invention is not limited to the present embodiment disclosed above, but the present invention may also be applied to another type of zoom lens optical system which includes one or more fixed lens groups.

In addition, in the above embodiment, the rear lens group L1 is provided as a component of the AF/AE shutter unit 21, and the AE motor 29 and the rear lens group driving motor 30 are mounted to the AF/AE shutter unit 21. With such a structure, the structure for supporting the front and rear lens groups L1 and L2 and the structure for driving the rear lens group L2 are both simplified. Optionally, the zoom lens barrel 10 may also be realized in such a manner by making the rear lens group L2 a member separate from the AF/AE shutter unit 21. The AF/AE shutter unit 21 may be provided with the shutter mounting stage 40, the circular driving member 49, the supporting member 47, the shutter blades 27, the shutter blade supporting ring 46 and the like, and that the rear lens group L2 is supported by another supporting member than the AF/AE shutter unit 21.

In the zoom lens camera of the present embodiment, the operation by rotation of the whole optical unit driving motor 25 and the rear lens group driving motor 30 will now be described with reference to FIGS. 14, 15, 16 and 17.

As shown in FIGS. 15 or 17, when the zoom lens barrel 10 is at the most retracted (withdrawn) position, i.e., the lens-housed condition, when the power switch is turned ON, the whole optical unit driving motor 25 is driven to rotate its drive shaft in the forward rotational direction by a small amount. The rotation of the motor 25 is transmitted to the driving pinion 15 through a gear train 26, which is supported by a supporting member 32 integrally formed with the fixed lens barrel block 12, to rotate the third moving barrel 16 in one predetermined rotational direction to advance forwardly along the optical axis 0. Therefore, the second moving barrel 19 and the first moving barrel 20 are each advanced by a small amount in the optical axis direction, along with the third moving barrel 16. Consequently, the camera is in a state where it is capable of photographing, with the zoom lens positioned at the widest position, i.e., the wide end. At this stage, because the amount of movement of the linear guide barrel 17, with respect to the fixed lens barrel block 12, is detected through the relative slide between the code plate 13a and the contacting terminal 9, the focal length of the zoom lens barrel 10, i.e., the front and rear lens groups L1 and L2, is detected.

In the photographable state as above described, when the aforementioned zoom operating lever is manually moved towards a "tele" side, or the "tele" zoom button is manually depressed to be turned ON, the whole optical unit driving motor 25 is driven to rotate its drive shaft in the forward rotational direction through the whole optical unit driving motor controller 60 so that the third moving barrel 16 rotates in the rotational direction to advance along the optical axis 0 via the driving pinion 15 and the outer peripheral gear 16b. Therefore, the third moving barrel 16 is advanced from the fixed lens barrel block 12 according to the relationship between the female helicoid 12a and the male helicoid 16a. At the same time, the linear guide barrel 17 moves forwardly in the optical axis direction together with the third moving barrel 16, without relative rotation with respect to the fixed lens barrel block 12, according to the relationship between the engaging projections 17c and the linear guide grooves 12b. Also at this time, the simultaneous engagement of the follower pins 18 with the respective lead slots 17b and linear guide grooves 16c causes the second moving barrel 19 to move forwardly relative to the third moving barrel 16 in the optical axis direction, while rotating together with the third moving barrel 16 in the same rotational direction relative to the fixed lens barrel block 12. The first moving barrel 20 moves forwardly from the second moving barrel 19 in the optical axis direction, together with the AF/AE shutter unit 21, without relative rotation with respect to the fixed lens barrel block 12, due to the above-noted structures in which the first moving barrel 20 is guided linearly by the linear guide member 22 and in which the follower pins 24 are guided by the lead grooves 19c. During such movements, because the moving position of the linear guide barrel 17 with respect to the fixed lens barrel block 12 is detected through the relative slide between the code plate 13a and the contacting terminal 9, the focal length set by the zoom operation device 62 is detected.

Conversely, when the zoom operating lever is manually moved towards a "wide" side, or the "wide" zoom button is manually depressed to be turned ON, the whole optical unit driving motor 25 is driven to rotate its drive shaft in the reverse rotational direction through the whole optical unit driving motor controller 60 so that the third moving barrel 16 rotates in the rotational direction to retract into the fixed lens barrel block 12 together with the linear guide barrel 17. At the same time, the second moving barrel 19 is retracted into the third moving barrel 16, while rotating in the same direction as that of the third moving barrel 16, and the first moving barrel 20 is retracted into the rotating second moving barrel 19 together with the AF/AE shutter unit 21. During the above retraction driving, as in the case of advancing driving as above described, the rear lens group driving motor 30 is not driven.

Figure 14:
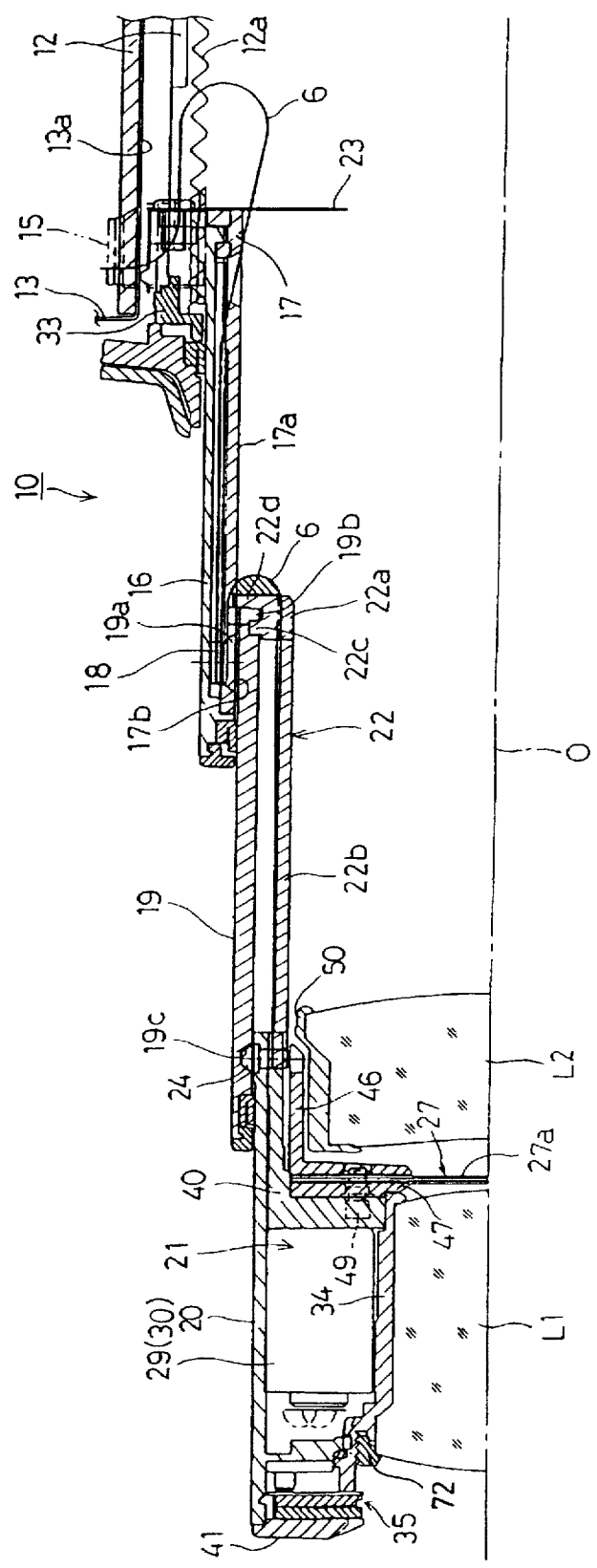
FIG. 14 is a sectional view of an upper part of the zoom lens barrel in a maximum extended state.
Figure 16:
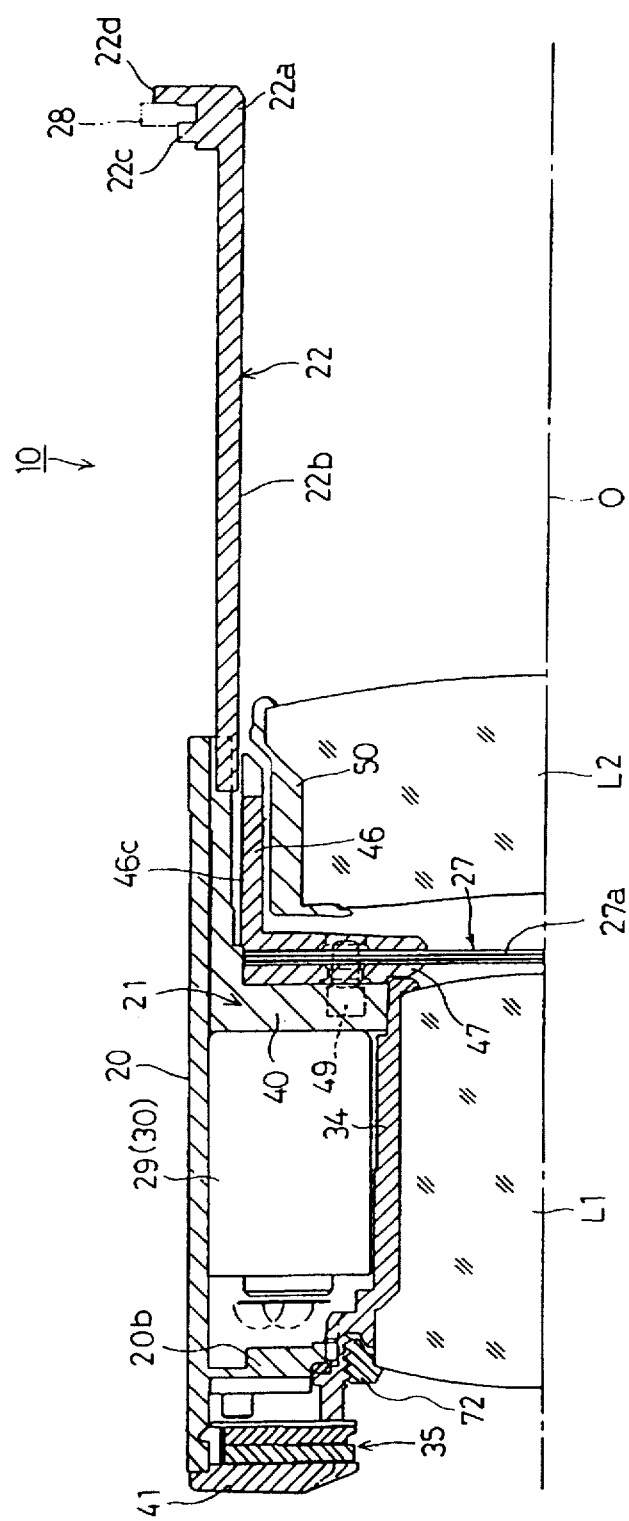
FIG. 16 is a sectional view of the upper part of the zoom lens barrel shown in FIG. 15 in the maximum extended state.

While the zoom lens barrel 10 is driven during the zooming operation, since the rear lens group driving motor 30 is not driven, the front lens group L1 and the rear lens group L2 move as a whole, maintaining a constant distance between each other as shown in FIGS. 14 or 16. The focal length input via the zoom code plate 13a and the contacting terminal 9 is indicated on an LCD panel (not shown) provided on the camera body.

At any focal length set by the zoom operating device 62, when the release button is depressed by a half-step, the object distance measuring apparatus 64 is actuated to measure a current subject distance. At the same time, the photometering apparatus 65 is actuated to measure a current subject brightness. Thereafter, when the release button is fully depressed, the whole optical unit driving motor 25 and the rear lens group driving motor 30 are respectively driven by an amount dictated in accordance with the focal length information set in advance and the subject distance information obtained from the object distance measuring apparatus 64. Accordingly, the front and rear lens groups L1 and L2 are respectively moved to specified positions to obtain a specified focal length to bring the subject into focus. Immediately after the subject is brought into focus, via the AE motor controller 66, the AE motor 29 is driven to rotate the circular driving member 49 by an amount corresponding to the subject brightness information obtained from the photometering apparatus 65 such that the shutter 27 is driven to open the shutter blades 27a by an amount specified to meet the required exposure. Immediately after such a shutter release operation in which the three shutter blades 27a are opened and subsequently closed, the whole optical unit driving motor 25 and the rear lens group driving motor 30 are both driven to move the front lens group L1 and the rear lens group L2 to their respective initial positions which they were at prior to a shutter release.

In the present embodiment of the zoom lens barrel 10, "Fantas Coat SF-6" is used at the coating 72e. However, another coating may be used as the coating 72e so long as it is waterproof and creates a smooth surface at the circular abutting surface 72b to substantially eliminate the gap between the circular abutting surface 72b and the circumferential portion fp.

Obvious changes may be made in the specific embodiments of the present invention described herein, such modifications being within the spirit and scope of the invention claimed. It is indicated that all matter contained herein is illustrative and does not limit the scope of the present invention.

What is claimed is:

1. A lens barrel having first, second and third barrels concentrically arranged in this order from an optical axis, said lens barrel comprising:

at least one cam slot formed on said second barrel, said at least one cam slot extending at an oblique angle to a direction of said optical axis;

at least one guide groove formed on an inner periphery of said third barrel;

at least one follower formed on an outer periphery of said first barrel and engaging with said at least one guide groove through said at least one cam slot; and at least one member integrally formed on an outer periphery of said second barrel adjacent to an end of said at least one cam slot, said at least one member comprising a surface positioned to contact said at least one follower when said at least one follower moves to said end of said at least one cam slot.

2. The lens barrel according to claim 1, wherein said at least one guide groove extends in said direction of said optical axis.

3. The lens barrel according to claim 1, wherein said end of said at least one cam slot is a rear end of said at least one cam slot, such that said at least one follower contacts said surface when said first barrel is fully retracted into said second barrel.

4. The lens barrel according to claim 1, wherein said second barrel is guided along said optical axis without rotating about said optical axis relative to a stationary block of said lens barrel.

5. The lens barrel according to claim 1, wherein said third barrel is fitted to said second barrel such that said third barrel is rotatable about said optical axis relative to said second barrel and immovable along said optical axis relative to said second barrel.

6. The lens barrel according to claim 1, wherein said at least one follower each comprises a follower projection formed on said outer periphery of said first barrel, and a ring member supported on said follower projection, wherein said follower projection and said ring member engage with said at least one cam slot and said at least one guide groove, respectively, and further wherein said ring member contacts said surface when said follower projection moves to said end of said cam slot.

7. The lens barrel according to claim 6, wherein said follower projection and said at least one cam slot, which engage with each other, are each tapered in a direction away from said optical axis.

8. The lens barrel according to claim 1, wherein said at least one cam slot is formed at a predetermined oblique angle with respect to said direction of said optical axis.

9. The lens barrel according to claim 1, wherein said end of said at least one cam slot is provided with an end slot which extends in a circumferential direction of said second barrel, said at least one member being formed along said end slot.

10. The lens barrel according to claim 3, wherein said second barrel comprises a first flange formed substantially on a rear end of said outer periphery of said second barrel so as to prevent said third barrel from moving forwardly from said second barrel along said optical axis, wherein said at least one member is integrally formed with said first flange.

11. The lens barrel according to claim 10, further comprising:

a second flange formed on a rearmost end of said outer periphery of said second barrel behind said first flange with a circumferential groove formed therebetween; and at least one projection formed on a rear end of said third barrel and extending inwardly toward said optical axis, said at least one projection being positioned in said circumferential groove and guidable along said circumferential groove such that said third barrel is rotatable about said optical axis relative to said second barrel while being restricted from moving along said optical axis relative to said second barrel.

12. The lens barrel according to claim 1, further comprising:

a stationary barrel in which said third barrel is positioned, a male helicoid being formed on an inner periphery of said stationary barrel; and a female helicoid formed on a rear end of an outer periphery of said third barrel and engaging with said male helicoid, such that said third barrel moves along said optical axis when driven to rotate about said optical axis relative to said stationary barrel.

13. The lens barrel according to claim 12, further comprising:

at least one engaging projection formed on said second barrel and extending outwardly in a radial direction away from said optical axis; and at least one linear guide groove formed on said inner periphery of said stationary barrel, said at least one engaging projection engaging with said at least one linear guide groove to guide said second barrel along said optical axis.

14. The lens barrel according to claim 6, further comprising at least one lead groove said at least one said follower projection being insertible into said at least one cam slot during an assembly of said lens barrel, said at least one lead groove being formed on an inner periphery of a rear end of said second barrel at said rear end of said at least one cam slot.

15. A camera provided with said lens barrel according to claim 12, said camera comprising a stationary block on which said stationary barrel is integrally formed.

16. A telescoping zoom lens having first, second and third barrels concentrically arranged in this order from an optical axis, said telescoping zoom lens comprising:

a plurality of cam slots forms on said second barrel and extending parallel to one another at an oblique angle with respect to a direction of said optical axis;

a plurality of guide grooves formed on an inner periphery of said third barrel;

a plurality of followers formed on an outer periphery of said first barrel and respectively engaging said plurality of guide grooves through said plurality of cam slots; and a plurality of members, each of said plurality of members integrally formed on an outer periphery of said second barrel adjacent to a rear end of a corresponding one of said plurality of cam slots, said plurality of followers respectively contacting said plurality of members when said first barrel is fully retracted into said second barrel.

17. A cam mechanism for a photographic lens which includes a moving barrel and a cam ring fitted on said moving barrel such that said moving barrel is movable relative to said cam ring along an optical axis of said photographic lens, said cam mechanism comprising:

at least one cam slot formed on said cam ring extending at an oblique angle with respect to a direction of said optical axis, wherein said at least one cam slot is formed such that a cross-section along a plane perpendicular to a longitudinal direction of said at least one cam slot tapers in a direction away from said optical axis;

at least one follower projection integrally formed on said moving barrel, wherein said at least one follower projection tapers in said direction away from said optical axis to be firmly fitted in said at least one cam slot;

at least one lead groove for said at least one follower projection insertible into said at least one cam slot during an assembly of said photographic lens, said at least one lead groove being formed on an inner periphery of a rear end of said moving barrel at a rear end of said at least one cam slot;

at least one follower provided on said at least one follower projection; and at least one stopper contacting said at least one follower when said moving barrel is filly retracted into said cam ring in order to prevent said moving barrel from detaching from said cam ring at a rear end thereof, said at least one stopper being integrally formed on an outer periphery of said moving barrel adjacent to said rear end of said at least one cam slot.

18. The cam mechanism according to claim 17, wherein said photographic lens is a zoom lens.

19. The cam mechanism according to claim 17, wherein said cam ring is guided along said optical axis without rotating about said optical axis relative to a stationary block of said photographic lens.

20. The cam mechanism according to claim 17, wherein said at least one follower is a ring member secured onto said at least one follower projection by a fixing screw engaged in said at least one follower projection.

21. The cam mechanism according to claim 17, wherein said at least one cam slot is oblique to said direction of said optical axis by a predetermined angle.

22. The cam mechanism according to claim 17, further comprising:

a rotational barrel fitted on said cam ring to be rotatable about said optical axis relative to said cam ring; and at least one guide groove formed on an inner periphery of said rotational barrel, said at least one follower being fitted in said at least one guide groove to be guided therealong.

23. The cam mechanism according to claim 22, wherein said at least one guide groove extends in said direction of said optical axis.

24. The cam mechanism according to claim 22, wherein said rotational barrel is fitted on said cam ring to be immovable along said optical axis relative to said cam ring.

25. A cam mechanism for a photographic lens which includes a moving barrel and a cam ring fitted on said moving barrel such that said moving barrel is movable relative to said cam ring along an optical axis of said photographic lens, said cam mechanism comprising:

a plurality of cam slots formed on said cam ring extending parallel to one another at an oblique angle with respect to a direction of said optical axis, wherein each of said plurality of cam slots is formed such that a cross-section along a plane perpendicular to a longitudinal direction of said plurality of cam slots tapers in a direction away from said optical axis;

a plurality of follower projections integrally formed on said moving barrel, wherein each of said plurality of follower projections tapers in said direction away from said optical axis to be firmly fitted in a corresponding one of said plurality of cam slots;

a plurality of lead grooves one lead groove for each of said plurality of follower projections insertible into a corresponding one of said plurality of cam slots during an assembly of said photographic lens, each of said plurality of lead grooves being formed on an inner periphery of a rear end of said moving barrel at a rear end of a corresponding one of said plurality of cam slots;

a plurality of followers each provided on a corresponding one of said plurality of follower projections; and a plurality of stoppers each contacting a corresponding one of said plurality of followers without contacting a corresponding one of said plurality of follower projections when said moving barrel is fully retracted into said cam ring in order to prevent said moving barrel from coming out of said cam ring from a rear end thereof, each of said plurality of stoppers being integrally formed on an outer periphery of said moving barrel adjacent to a rear end of a corresponding one of said plurality of cam slots.

* * * * *